US012344957B1

(12) United States Patent
Bondokov et al.

(10) Patent No.: US 12,344,957 B1
(45) Date of Patent: Jul. 1, 2025

(54) TUNGSTEN-INFUSED ALUMINUM NITRIDE CRYSTALS AND METHODS OF FORMING THEM

(71) Applicant: CRYSTAL IS, INC., Green Island, NY (US)

(72) Inventors: Robert T. Bondokov, Watervliet, NY (US); Sean P. Branagan, Green Island, NY (US); Naoki Ishigami, Green Island, NY (US); Thomas Miebach, Malta, NY (US); Jianfeng Chen, Ballston Lake, NY (US)

(73) Assignee: CRYSTAL IS, INC., Green Island, NY (US)

( * ) Notice: Subject to any disclaimer, the term of this patent is extended or adjusted under 35 U.S.C. 154(b) by 660 days.

(21) Appl. No.: 17/545,171

(22) Filed: Dec. 8, 2021

Related U.S. Application Data

(60) Provisional application No. 63/126,655, filed on Dec. 17, 2020.

(51) Int. Cl.
*C30B 29/40* (2006.01)
*C30B 23/02* (2006.01)
*H01L 21/02* (2006.01)

(52) U.S. Cl.
CPC ........... *C30B 29/403* (2013.01); *C30B 23/02* (2013.01)

(58) Field of Classification Search
CPC .... C30B 29/403; C30B 23/02; H01L 21/0254
See application file for complete search history.

(56) References Cited

U.S. PATENT DOCUMENTS

2013/0251615 A1* 9/2013 D'Evelyn ................ C30B 7/10
423/265
2019/0153618 A1* 5/2019 Bondokov .......... H01L 33/0075

FOREIGN PATENT DOCUMENTS

FR 3073321 A1 * 5/2019 ............. C30B 1/023

OTHER PUBLICATIONS

Machine translation of FR-3073321-A1, 9 pages. (Year: 2018).*

\* cited by examiner

*Primary Examiner* — Matthew E. Hoban
*Assistant Examiner* — Lynne Edmondson
(74) *Attorney, Agent, or Firm* — Morgan, Lewis & Bockius LLP

(57) ABSTRACT

In various embodiments, polycrystalline AlN ceramics, single-crystalline AlN boules, and/or single-crystalline AlN substrates are infused with tungsten present on the surface and/or within the bulk thereof. The tungsten-infused AlN materials may be utilized to fabricate electronic and/or optoelectronic (e.g., light-emitting) devices thereon.

20 Claims, 19 Drawing Sheets

XRD pattern

TUNGSTEN-INFUSED ALUMINUM NITRIDE CRYSTALS AND METHODS OF FORMING THEM

RELATED APPLICATIONS

This application claims the benefit of and priority to U.S. Provisional Patent Application No. 63/126,655, filed Dec. 17, 2020, the entire disclosure of which is hereby incorporated herein by reference.

TECHNICAL FIELD

In various embodiments, the present invention relates to the fabrication of single-crystal aluminum nitride (AlN).

BACKGROUND

Aluminum nitride (AlN) holds great promise as a semiconductor material for numerous applications, e.g., optoelectronic devices such as short-wavelength light-emitting diodes (LEDs) and lasers, dielectric layers in optical storage media, electronic substrates, and chip carriers where high thermal conductivity is essential, among many others. In principle, the properties of AlN may allow light emission at wavelengths down to around 200 nanometers (nm) to be achieved. Recent work has demonstrated that ultraviolet (UV) LEDs have superior performance when fabricated on low-defect AlN substrates prepared from bulk AlN single crystals. The use of AlN substrates is also expected to improve high-power radio-frequency (RF) devices made with nitride semiconductors due to the high thermal conductivity with low electrical conductivity. However, the commercial feasibility of AlN-based semiconductor devices is limited by the scarcity and high cost of low-defect single crystals of AlN.

To make single-crystal AlN substrates more readily available and cost-effective, and to make the devices built thereon commercially feasible, it is desirable to grow AlN bulk crystals at a high growth rate (>0.5 mm/hr) while preserving crystal quality. The most effective method of growing AlN bulk single crystals is the "sublimation-recondensation" method that involves sublimation of lower-quality (typically polycrystalline) AlN source material and recondensation of the resulting vapor to form the single-crystal AlN. U.S. Pat. Nos. 6,770,135 (the '135 patent), 7,638,346 (the '346 patent), 7,776,153 (the '153 patent), and 9,028,612 (the '612 patent), the entire disclosures of which are incorporated by reference herein, describe various aspects of sublimation-recondensation growth of AlN, both seeded and unseeded.

While AlN substrates are enabling platforms for the fabrication of UV light-emitting devices such as LEDs, their performance in such applications is often limited by their transparency to UV light (i.e., "UV transparency") or lack thereof. AlN substrates with high UV transparency are often difficult to produce, as UV transparency is compromised by contamination and/or point defects introduced during the AlN growth process. Such issues have been addressed on a limited basis via techniques disclosed in U.S. Pat. Nos. 8,012,257, 9,034,103, and 9,447,519, the entire disclosure of each of which is incorporated herein by reference. Specifically, these patents disclose techniques for controlling the introduction of oxygen impurities during polycrystalline AlN source-material preparation and sublimation-recondensation growth of single-crystal AlN. While such techniques were reported as enabling production of bulk AlN crystals having low absorption coefficients, and thus high UV transparency, at some wavelengths, they appear not to adequately address UV transparency at all wavelengths of interest, e.g., deep-UV wavelengths, i.e., wavelengths ranging from approximately 210 nm to approximately 280 nm. Continuing challenges related to achieving high UV transparency may be due to the presence of other impurities within the AlN, such as carbon. Photon extraction from light-emitting devices based on AlN is also an ongoing challenge that is often addressed via substrate removal and/or texturing techniques.

In addition, conventional AlN grown at high temperatures, such as AlN grown via sublimation-recondensation, can lack ductility at elevated temperatures and thus be susceptible to cracking or fracture due to thermally induced stresses, for example, due to thermal gradients during growth or cool-down and/or mismatch in coefficient of thermal expansion (or "CTE mismatch"). In view of this, there is a need for improved AlN single crystals capable of supporting better UV device performance and that are more robust during and after crystal growth and processing.

SUMMARY

In various embodiments of the present invention, AlN single crystals are infused with precipitates (e.g., particles such as nanoparticles and/or microparticles) of tungsten (W) that imbue the AlN with superior properties without deleterious impact on the crystalline quality of the AlN. Conventional techniques of AlN production typically focus on removing "impurities" such as W from AlN. Surprisingly, the present inventors have found that AlN single crystals infused with W precipitates exhibit improved properties and support the production of devices (e.g., light-emitting devices such as light-emitting diodes and lasers) thereon having improved performance.

In accordance with embodiments of the invention, W material is deliberately introduced into the AlN ceramic source material utilized during subsequent formation of single-crystal AlN by, e.g., sublimation-recondensation. In the resulting AlN single crystals, W precipitates may be located within the AlN crystal lattice in the form of polycrystalline precipitates (or "balls" or "particles") on or near the crystal surface, and/or as single-crystalline inclusions. (As utilized herein, the term "balls" does not imply that precipitates are necessarily spherical or quasi-spherical; rather, balls may have curved and/or faceted/straight surfaces and may be regular or irregular in shape or diameter.) In both locations and forms, the W precipitates typically do not result in formation of associated dislocations or other crystalline defects.

Beneficially, W-infused AlN single crystals in accordance with embodiments of the invention may facilitate improvements in UV transparency. Without wishing to be bound by theory, the present inventors postulate that the W precipitates getter impurities within the AlN, such as carbon, that decrease UV transparency. When such impurities are gettered by W, they are less likely to create associated point defects or energy levels capable of absorbing light. In addition, W-infused AlN single crystals in accordance with embodiments of the invention may exhibit improved ductility at elevated temperatures, resulting in more robust material that is resistant to cracking and fracturing due to, for example, thermal gradients or CTE mismatch. As such, the W-infused AlN single crystals in accordance with embodiments of the invention are more easily and efficiently produced, handled, and processed (e.g., into substrates for devices such as light-emitting devices). Moreover, the W precipitates within the single-crystal AlN may aid in photon extraction, e.g., via light scattering, thereby improving the performance of light-emitting devices fabricated on W-infused AlN substrates.

In accordance with embodiments of the present invention, W-infused single-crystal AlN may be fabricated via sublimation-recondensation from polycrystalline/ceramic AlN source material that itself has W deliberately included within its volume. While prior-art growth techniques for single-crystal AlN often utilize crucibles, enclosures, and/or associated hardware formed of W, the present inventors have found that such "incidental" W within or of the crystal-growth enclosure is insufficient to produce the W-infused AlN crystals in accordance with embodiments of the present invention. Rather, additional amounts of W, originally in the form of, e.g., flakes, powder, foil, particles, etc., may be added to the ceramic AlN source material during the production thereof in order to provide W sufficient to be infused within the single-crystal AlN during growth thereof.

As described in the '135 patent, the '346 patent, the '153 patent, and the '612 patent, the sublimation-recondensation growth process is desirably performed under a steep axial (i.e., in the direction of crystal growth away from a seed, if a seed is present) temperature gradient, while radial temperature gradients may be utilized to control the diameter of the growing crystal and influence its crystalline quality. In various embodiments of the present invention, the radial and/or axial thermal gradients within the crystal-growth crucible utilized to promote and control the growth of the AlN material may be controlled in various different manners. For example, individual heating elements arranged around the crucible may be powered to different levels (and thus different temperatures) to establish thermal gradients within the crucible. In addition or instead, thermal insulation may be selectively arranged around the crucible such that thinner and/or less insulating insulation is positioned around areas of higher desired temperature. As detailed in the '612 patent, thermal shields may also be arranged around the crucible, e.g., above and/or below the crucible, in any of a multitude of different arrangements in order to establish desired thermal gradients within the crucible.

Embodiments of the invention may be utilized in conjunction with diameter-expansion techniques (and associated techniques to increase lateral growth rates) detailed in U.S. patent application Ser. No. 16/991,278, filed on Aug. 12, 2020 (the '278 application), and U.S. patent application Ser. No. 16/991,279, filed on Aug. 12, 2020 (the '279 application), the entire disclosure of each of which is incorporated by reference herein. In this manner, W-infused AlN single crystals having large crystal augmentation parameters (as defined in the '278 and '279 applications) may be produced.

Although embodiments of the invention have been presented herein utilizing AlN as the exemplary crystalline material fabricated in accordance therewith, embodiments of the invention may also be applied to other crystalline materials such as silicon carbide (SiC) and zinc oxide (ZnO); thus, herein, all references to AlN herein may be replaced, in other embodiments, by SiC or ZnO. As utilized herein, the term "diameter" refers to a lateral dimension (e.g., the largest lateral dimension) of a crystal, particulate, growth chamber, or other object, even if the crystal, particulate, growth chamber, or other object is not circular and/or is irregular in cross-section.

As utilized herein, a "substrate" or a "wafer" is a portion of a previously grown crystalline boule having top and bottom opposed, generally parallel surfaces. Boules (and generally, "single crystals" or "bulk crystals" as referred to herein) are three-dimensional bulk crystals (as opposed to, e.g., powder particles or needle-like, acicular crystallites). Substrates typically have thicknesses ranging between 200 µm and 1 mm and may be utilized as platforms for the epitaxial growth of semiconductor layers and the fabrication of semiconductor devices (e.g., light-emitting devices such as lasers and light-emitting diodes, transistors, power devices, etc.) thereon. Once layers and/or devices have been formed on a substrate, all or a portion of the substrate may be removed therefrom as part of subsequent processing; thus, when such structures are present, remnant "substrates," when still present, may have thicknesses less than those mentioned above. As utilized herein, "room temperature" is 25° C.

In an aspect, embodiments of the invention feature a crystal that includes, consists essentially of, or consists of single-crystalline AlN and a plurality of W precipitates present as polycrystalline particles disposed on a surface of the crystal and/or as single-crystalline inclusions disposed within a volume of the crystal.

Embodiments of the invention may include one or more of the following in any of a variety of combinations. The W precipitates may be present as polycrystalline particles disposed on the surface of the crystal at a density ranging from approximately 0 to approximately $1 \times 10^5$ cm$^{-2}$, or at a density ranging from approximately 10 to approximately $1 \times 10^5$ cm$^{-2}$, or at a density ranging from approximately 100 to approximately $1 \times 10^5$ cm$^{-2}$. The total concentration of W within the crystal may range from approximately 5 ppm to approximately 210 ppm by weight. The crystal may be free of crystalline defects (e.g., dislocations and/or stacking faults) associated with (e.g., extending from and/or into) the W precipitates. The crystal may be a boule having a maximum diameter ranging from approximately 50 mm to approximately 150 mm. The minimum diameter of the boule may range from approximately 25 mm to approximately 100 mm. The length of the boule may range from approximately 15 mm to approximately 45 mm.

The crystal may be a substrate having a diameter of at least approximately 25 mm, at least approximately 50 mm, at least approximately 75 mm, at least approximately 100 mm, or at least approximately 150 mm. The diameter may be at most approximately 150 mm. The W precipitates may form a pattern of striations on the surface of the crystal. The striations may extend radially toward an outer edge of the crystal. A light-emitting device (e.g., a light-emitting diode or a laser) may be disposed over the crystal. The light-emitting device may be configured to emit ultraviolet light.

In another aspect, embodiments of the invention feature a polycrystalline ceramic comprising, consisting essentially of, or consisting of AlN and a plurality of W particles and/or W flakes therein.

Embodiments of the invention may include one or more of the following in any of a variety of combinations. The W content of the ceramic may range from approximately 10 ppm to approximately 3600 ppm by weight. The diameter of the ceramic may be at least approximately 0.5 cm and/or at most approximately 2 cm. The oxygen concentration of the ceramic may be less than 100 ppm. The carbon concentration of the ceramic may be less than 60 ppm. The ceramic may contain less than 0.1% excess Al.

In yet another aspect, embodiments of the invention feature a method of forming a W-infused polycrystalline AlN ceramic. W metal and one or more pellets comprising, consisting essentially of, or consisting of Al are provided within a crucible. Each pellet is melted and reacted with nitrogen at a reaction temperature to thereby form a polycrystalline AlN ceramic, at least some of the W metal being incorporated into the polycrystalline AlN ceramic during formation thereof.

Embodiments of the invention may include one or more of the following in any of a variety of combinations. The nitrogen may be provided as nitrogen gas and/or forming gas. The reaction temperature may range from approximately 1900° C. to approximately 2200°. At least a portion of the W metal may be contained within one or more of the pellets. At least a portion of the W metal may be provided separately from the one or more Al pellets. At least a portion of the W metal may be provided in the form of flakes, powder, foil, pellets, and/or particles. When the polycrystalline AlN ceramic reaches approximately room temperature after the reaction, the polycrystalline AlN ceramic may have (i) less than approximately 1% excess Al and/or (ii) an oxygen concentration of less than approximately 100 ppm. The crucible may include, consist essentially of, or consist of a bottom plug and a foil wrap. The W content of the ceramic may range from approximately 10 ppm to approximately 3600 ppm by weight.

At least a portion of the polycrystalline AlN ceramic may be disposed into a second crucible. The at least a portion of the polycrystalline AlN ceramic may be annealed in the second crucible, thereby forming a polycrystalline AlN source. The annealing may include, consist essentially of, or consist of (i) heating the at least a portion of the polycrystalline AlN ceramic at a first temperature ranging from 1100° C. to 2000° C. for a first time ranging from 2 hours to 25 hours, and (ii) thereafter, heating the at least a portion of the polycrystalline AlN ceramic at a second temperature ranging from 1900° C. to 2250° C. for a second time ranging from 3 hours to 15 hours, the second temperature being greater than the first temperature, or (i) heating the at least a portion of the polycrystalline AlN ceramic during a temperature ramp to a third temperature ranging from 1900° C. to 2250° C. over a third time ranging from 5 hours to 25 hours, and (ii) thereafter, heating the at least a portion of the polycrystalline AlN ceramic at a fourth temperature ranging from 1900° C. to 2250° C. for a fourth time ranging from 3 hours to 25 hours. The polycrystalline AlN source may be cooled to approximately room temperature. Prior to disposing the at least a portion of the polycrystalline AlN ceramic into the second crucible, (i) the polycrystalline AlN ceramic may be fragmented into fragments, and (ii) one or more fragments each having a width greater than approximately 0.5 cm and less than approximately 2 cm may be selected as the at least a portion of the polycrystalline AlN ceramic.

In another aspect, embodiments of the invention feature a method of forming W-infused single-crystal aluminum nitride (AlN). A bulk polycrystalline AlN ceramic comprising W therewithin is provided. At least a portion of the AlN ceramic is disposed into a crystal-growth crucible. A seed crystal comprising, consisting essentially of, or consisting of single-crystal AlN or W-infused single-crystal AlN is disposed into the crystal-growth crucible. The crystal-growth crucible is disposed into a furnace. The crystal-growth crucible is heated with the furnace to a growth temperature of at least 2000° C. While the crystal-growth crucible is at the growth temperature, (i) the AlN ceramic is sublimed to (a) form vapor comprising aluminum and nitrogen and (b) liberate W metal from the AlN ceramic, the vapor condensing on the seed crystal to form a single-crystalline AlN boule that incorporates the liberated W therewithin, and (ii) the crystal-growth crucible is moved relative to the furnace, a growth rate of the AlN boule being approximately equal to a rate of relative motion between the crystal-growth crucible and the furnace. Thereafter, the W-infused AlN boule is cooled to approximately room temperature.

Embodiments of the invention may include one or more of the following in any of a variety of combinations. The W content of the ceramic may range from approximately 10 ppm to approximately 3600 ppm by weight. The total concentration of W within the AlN boule may range from approximately 5 ppm to approximately 210 ppm by weight. The liberated W may be incorporated within the AlN boule as polycrystalline particles disposed on a surface of the AlN boule and/or as single-crystalline inclusions disposed within a volume of the AlN boule.

Before subliming the AlN ceramic, the crystal-growth crucible may be maintained at the growth temperature for a soak time that may range from 1 hour to 10 hours. The soak time may be approximately 5 hours. The growth temperature may be approximately 2300° C. or less. A diameter of the AlN boule is at least approximately 25 mm, at least approximately 50 mm, at least approximately 75 mm, or at least approximately 100 mm. Prior to disposing the at least a portion of the AlN ceramic into the crystal-growth crucible, (i) the AlN ceramic may be fragmented into fragments, and (ii) one or more fragments each having a width greater than approximately 0.5 cm and less than approximately 2 cm may be selected as the at least a portion of the AlN ceramic. A crystalline orientation of the seed crystal may be substantially parallel to a c-axis. The growth rate may be at least 0.5 mm/hour. The diameter of the seed crystal may be approximately 25 mm or larger.

A W-infused single-crystal AlN substrate having a diameter of at least 25 mm may be separated from the at least a portion of the AlN boule. A light-emitting device (e.g., a light-emitting diode or a laser) may be fabricated over at least a portion of the W-infused single-crystal AlN substrate. The light-emitting device may be configured to emit ultraviolet light.

After the W-infused AlN boule is cooled to approximately room temperature, at least a portion of the W-infused AlN boule may be disposed within a heating chamber different from the crystal-growth crucible. Nitrogen gas may be provided within the heating chamber at a pressure ranging from approximately 0.5 bar to approximately 2 bars. A temperature within the heating chamber may be ramped to an annealing temperature at a ramp rate ranging from approximately 1° C./min to approximately 50° C./min. The annealing temperature may range from approximately 2100° C. to approximately 2500° C. The at least a portion of the W-infused AlN boule may be annealed at the annealing temperature for a time period that may range from approximately 0.5 hour to approximately 100 hours. Thereafter, the at least a portion of the W-infused AlN boule may be cooled via a cooling cycle. The cooling cycle may include, consist essentially of, or consist of (i) cooling the at least a portion of the W-infused AlN boule from the annealing temperature to an intermediate temperature ranging from 800° C. to 1250° C. over a time period ranging from 10 hours to 100 hours, and (ii) thereafter, cooling the at least a portion of the W-infused AlN boule to approximately room temperature. Nitrogen gas, ay be provided within the heating chamber at a pressure ranging from approximately 1 bar to approximately 2 bars. The at least a portion of the W-infused AlN boule may be annealed for a time period ranging from approximately 0.5 hour to approximately 5 hours.

During the cooling cycle, the at least a portion of the W-infused AlN boule may be cooled from the annealing temperature to the intermediate temperature over a time period ranging from 10 hours to 20 hours. Before disposing the at least a portion of the W-infused AlN boule within the heating chamber, one or more W-infused AlN substrates may be separated from the W-infused AlN boule. The at least a portion of the W-infused AlN boule may include, consist essentially of, or consist of the one or more W-infused AlN substrates. The at least a portion of the W-infused AlN boule may include, consist essentially of, or consist of the entire AlN boule. Prior to disposing the at least a portion of the W-infused AlN boule within the heating chamber, an interior of the heating chamber may be heated to a temperature no less than 2600° C. under a pressure of less than 1 bar. The interior of the heating chamber may be heated for a time ranging from approximately 0.5 hour to approximately 2 hours. The heating chamber may include, consist essentially of, or consist of a resistive furnace or a radio-frequency furnace. The at least a portion of the W-infused AlN boule may be annealed at the annealing temperature isothermally or quasi-isothermally.

Embodiments of the invention may include AlN boules, wafers, and/or light-emitting devices formed or formable in accordance with any of the above methods.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean±10%, and in some embodiments, ±5%. All numerical ranges specified herein are inclusive of their endpoints unless otherwise specified. The term "consists essentially of" means excluding other materials that contribute to function, unless otherwise defined herein. Nonetheless, such other materials may be present, collectively or individually, in trace amounts; that is, to consist essentially of one or more materials may mean to consist of those one or more materials, plus unintentional impurities.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments of the present invention enable the fabrication of high-quality single-crystal AlN bulk crystals (i.e., boules and/or substrates) that are infused with W precipitates. In various embodiments, production of such AlN bulk crystals begins with the fabrication of polycrystalline AlN source material that may be utilized in a vapor-transport growth process (e.g., sublimation-recondensation) to form the AlN bulk crystals. In various embodiments, the AlN source material also desirably has a fairly low oxygen content, e.g., concentrations of approximately 100 ppm to approximately 400 ppm. For example, polycrystalline AlN source material may be fabricated, at least in part, in accordance with the techniques described in the '519 patent, which reports polycrystalline AlN ceramic material having an oxygen content of about 100 ppm or less and which possesses a high degree of stoichiometry, i.e., excess Al of less than approximately 0.1%. However, embodiments of the invention additionally feature the deliberate incorporation of W into the AlN ceramic material to enable the fabrication of W-infused AlN single crystals.

Figures 2A, 2B, 2C:
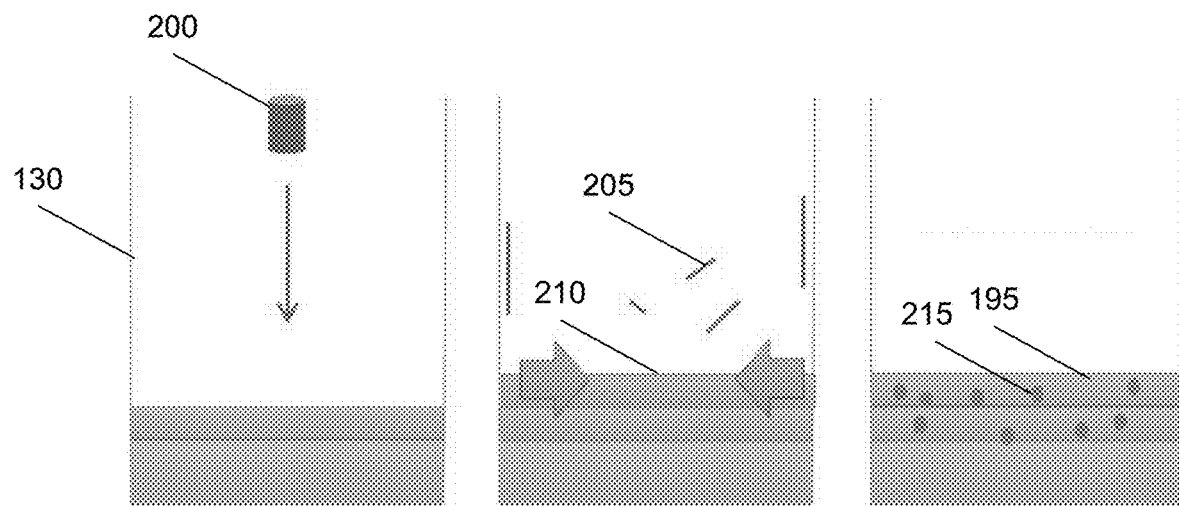
FIGS. 2A-2C schematically depict stages of forming W-infused polycrystalline ceramic source material in accordance with various embodiments of the invention.

In various embodiments, the polycrystalline AlN ceramic may be fabricated in accordance with the techniques described in the '519 patent, i.e., a "pellet-drop" technique using high-purity Al pellets. As detailed below, this technique is modified, in accordance with embodiments of the invention, via the incorporation of W metal into the AlN ceramic as it is formed. For example, referring to FIGS. 1A-1E, a reactor 100 may be utilized in the formation of a polycrystalline AlN ceramic 195 that includes, consists essentially of, or consists of high-purity AlN with an added W phase. Reactor 100 may include a reaction vessel 110, which may be fabricated of double-walled stainless steel and may be water cooled. Reaction vessel 110 may be capable of a maximum internal gas pressure of approximately 45 pounds per square inch (psi), and may be evacuated, e.g., by a turbo pump 111 (backed by a mechanical pump 112) to approximately $10^{-7}$ Torr. A feeder mechanism 120 is connected to the top of reaction vessel 110, and may be evacuated and pressurized with the same gases and pressures as reaction vessel 110. Feeder mechanism 120 may be isolated from reaction vessel 110 by an isolation valve 122. Pellets (which may include, consist essentially of, or consist of high (e.g., five nines) purity undoped Al and may be shaped approximately cylindrically) released from feeder mechanism 120 are directed to a crucible 130 by an upper funnel 132 and a lower funnel 134. In various embodiments, as shown in FIGS. 2A-2C, W metal may also be released into crucible 130 via feeder mechanism 120 or a different feeder mechanism.

In various embodiments, crucible 130 includes, consists essentially of, or consists of a bottom plug 136 and a foil wrap 137. Bottom plug 136 may be approximately cylindrical with, e.g., a diameter of approximately 2 inches and a height of approximately 0.5 inches. Bottom plug 136 may include, consist essentially of, or consist of W or another high-melting-point material inert to AlN. Foil wrap 137 wraps around bottom plug 136, forming a cylinder open at the top and sealed at the bottom by bottom plug 136. Foil wrap 137 may include, consist essentially of, or consist of W, or another high melting point material inert to AlN, and may have a thickness of approximately 0.001 inch. In an embodiment, foil wrap 137 may be wrapped around bottom plug 136 multiple times, e.g., a three-ply foil wrap 137 is formed by wrapping W foil around bottom plug 136 three times. Foil wrap 137 may be held in place by wire 138. Wire 138 may include, consist essentially of, or consist of a tungsten-rhenium alloy (e.g., 25% rhenium) and have a thickness of approximately 0.01 inch.

As shown, crucible 130 is disposed within a reaction zone 140 and on top of a crucible stand 142. Both reaction zone 140 and crucible stand 142 may include, consist essentially of, or consist of W. Lower funnel 134 is disposed above the top opening of crucible 130, and may include, consist essentially of, or consist of W. Lower funnel 134 is shaped to direct pellets from feeder mechanism 120 and upper funnel 132 into crucible 130.

Reactor 100 includes an inductive heating coil 150, which wraps around insulation 160. Insulation 160 may include, consist essentially of, or consist of bubble alumina available from Zircar Ceramics, Inc. of Florida, New York held within a quartz holder. Inductive heating coil 150 may be a 10 kHz, 20 kilowatt inductive heating system available from Mesta Electronics, Inc. of N. Huntingdon, Pennsylvania, and may heat to temperatures up to approximately 2300° C. An optical pyrometer port 162 enables the measurement of temperature inside the reaction zone defined by inductive heating coil 150 by pyrometry. Gas from a series of gas tanks representatively indicated at 168 flows into reactor 100 from a bottom inlet 170 and/or a top inlet 172. The gas may include, consist essentially of, or consist of nitrogen or forming gas, and is filtered by a gas filter 174 that reduces levels of contaminants such as oxygen, water vapor, and hydrocarbons to less than 10 ppb. A vertical drive 180 is used to move crucible 130 in and out of the hot zone created by inductive heating coil 150. A conventional control station 190 includes electronic controls and power supplies for all of the components associated with reactor 100.

In order to form the polycrystalline ceramic 195, pellets are cleaned in preparation for loading into feeder mechanism 120. First, the pellets are sifted (with or without water) in order to remove oddly shaped pellets or small shavings. In various embodiments, a refined cleaning procedure may be utilized to reduce the amount of carbon on the pellets. Semiconductor-grade Al pellets are commercially available, and when received such pellets typically have carbon concentrations ranging from 25 ppm to about 40 ppm by weight, as measured by Instrumental Gas Analysis (IGA) (e.g., at a vendor such as EAG Laboratories of Liverpool, New York). The pellets may be ultrasonically cleaned in isopropyl alcohol (IPA) (e.g., for a time period of approximately 20 minutes), etched in hydrochloric acid (HCl) (e.g., for a time period of approximately 7 minutes), and rinsed several times (e.g. three times) in distilled water. After another ultrasonic clean in IPA (e.g., for a time period of approximately 20 minutes), the pellets are immersed in a mixture (e.g., a 50%-50% solution by volume) of HF and $HNO_3$ (e.g., for a time period of approximately 2 minutes) at room temperature. Finally, the pellets are rinsed in distilled water and multiple times in IPA, whereupon they may be stored in an inert or nitrogen atmosphere prior to loading in feeder mechanism 120. After cleaning, the pellets may have an average carbon content of approximately 5 ppm by weight, as measured by IGA.

Crucible 130 is loaded into reactor 100, and pellets are loaded into feeder mechanism 120. In various embodiments, W metal in the form of, e.g., flakes, powder, pellets, particles, etc., may also be loaded into feeder mechanism 120 or another feeder mechanism (not shown). In other embodiments, one or more (or even all) of the pellets in feeder mechanism 120 may include, consist essentially of, or consist of both Al and W (e.g., an Al—W mixture or alloy). Reaction chamber 110 and feeder mechanism 120 are evacuated, e.g., to a pressure less than approximately $5×10^{-5}$ Torr, and refilled with forming gas to a pressure of approximately 6 psi. Either nitrogen ($N_2$) gas or forming gas flows into reaction chamber 110 from bottom inlet 170 and/or top inlet 172 at a rate of approximately 0.25 lpm. The flow of gas provides a sufficient amount of nitrogen in reaction chamber 110 to convert the pellet(s) to AlN (as described below).

Inductive heating coil 150 may heat crucible 130 to approximately 1900-2200° C., although even higher temperatures may be utilized. In an embodiment, inductive heating coil 150 heats crucible 130 to approximately 2000-2050° C. Temperatures in this range have been found to be sufficient to totally react the pellets into stoichiometric AlN (which includes less than approximately 1% unreacted Al) and to drive off higher vapor pressure impurities that may be trapped within polycrystalline ceramic 130 and create optical absorptions. The temperature at crucible 130 may be measured by pyrometry through optical pyrometer port 162. Once crucible 130 reaches the desired temperature, the temperature and gas flow conditions within reactor 100 are held constant for a pre-soak cycle (e.g., approximately 3 hours). The pre-soak cleans crucible 130 and other parts of reactor 100 of contaminants, e.g., oxides, before the introduction of the Al pellets.

A reaction cycle is then performed to form polycrystalline ceramic 195. Pellets are dropped from feeder mechanism 120, through upper funnel 132 and lower funnel 134, into crucible 130. The pellets may each weigh approximately 0.23 gram, and may be dropped at a rate of approximately 1 every 90 seconds. Feeder mechanism 120 may incorporate an optical counter that counts actual pellet drops and may cycle feeder mechanism 120 to drop an additional pellet in case of a loading error. The pellets land on bottom plug 136 (or the portion of polycrystalline ceramic 195 already produced thereon), melt, and react with the nitrogen gas to form polycrystalline ceramic 195. Each subsequent pellet dropped from feeder mechanism 120 reacts and increases the size and volume of polycrystalline ceramic 195. In an embodiment, substantially all of each pellet reacts to form polycrystalline ceramic 195. After a desired number of pellets are reacted to form polycrystalline ceramic 195, the reaction gas flow rate and temperature are maintained for a time period (e.g., approximately 1 hour) to ensure that the reaction is complete.

During the reaction cycle, W metal is also dropped onto the bottom plug 136 and/or the growing polycrystalline ceramic 195, as shown in FIGS. 2A-2C. For example, W may be dropped every time an Al pellet is dropped, or W may be released less frequently (e.g., every 2-5 or 2-10 pellets). FIGS. 2A and 2B respectively depict the dropping of an Al pellet 200 and the dropping of W (depicted as flakes) 205 into the molten Al (or molten Al—W) 210. In various embodiments, as mentioned above, all or some of the pellets themselves may contain W (e.g., an Al—W alloy), and therefore W metal is introduced into the crucible via the pellets themselves. The molten Al dissolves the W metal, and after nitridization of the Al to form the main AlN phase, a W phase 215 is included within the polycrystalline ceramic 195, as shown in FIG. 2C. In various embodiments, polycrystalline ceramic 195 formed in accordance with embodiments of the invention contains W in an amount of at least (all values are by weight) 100 ppm, 120 ppm, 150 ppm, 200 ppm, 300 ppm, 500 ppm, 1000 ppm, 1500 ppm, 2000 ppm, 2500 ppm, 3000 ppm, 3500 ppm, or 4000 ppm. In various embodiments, the amount of W in the polycrystalline ceramic 195 may be at most 10,000 ppm, or 8000 ppm, or 5000 ppm. Instead of or in addition to W metal being dropped into the crucible 130 during the dropping of the Al pellets, in various embodiments W metal in the form of, e.g., flakes, powder, pellets, particles, etc., may be placed in the crucible 130 (e.g., on top of plug 136) before the Al pellets are dropped. During the melting and reaction of the Al, the W metal will be dissolved into the molten Al and incorporated into the AlN polycrystalline ceramic. In various embodiments, one or more portions of a foil wrap 137 that includes, consists essentially of, or consists of W may, during preparation of the crucible 130, be deliberately placed over or on the top surface of the W plug, in order to facilitate W incorporation into the polycrystalline AlN ceramic. In various embodiments, all or a portion of the foil wrap 137 (that includes, consists essentially of, or consists of W) may be coated with Al, and/or Al foil may be included within the foil wrap 137, in order to facilitate increased dissolving of W, e.g., during temperature ramps and/or at elevated temperatures during formation of the polycrystalline AlN ceramic.

In various embodiments, the pellet-drop process for forming the polycrystalline AlN ceramic may be adjusted to facilitate formation of W-infused AlN ceramic. For example, at one or more times between (or even during) the dropping of Al pellets, the flow of nitrogen gas may be stopped, and the Al pellet (and any AlN ceramic having already been formed) are heated at an elevated temperature (e.g., at least 1600° C., and up to at least the reaction temperature utilized in the pellet-drop process) under vacuum to promote W infusion while retarding nitridization. Such heating cycles under vacuum may be utilized one or more times during the pellet-drop process. In addition or instead, the pellet-drop process detailed above may be initiated with one or more of the Al pellets (and/or another source of Al, such as Al powder or foil) placed at the bottom of crucible 130. In this manner, the amount of W dissolution into the AlN ceramic, at least during temperature ramps to elevated temperature, may be increased.

Figure 2D:
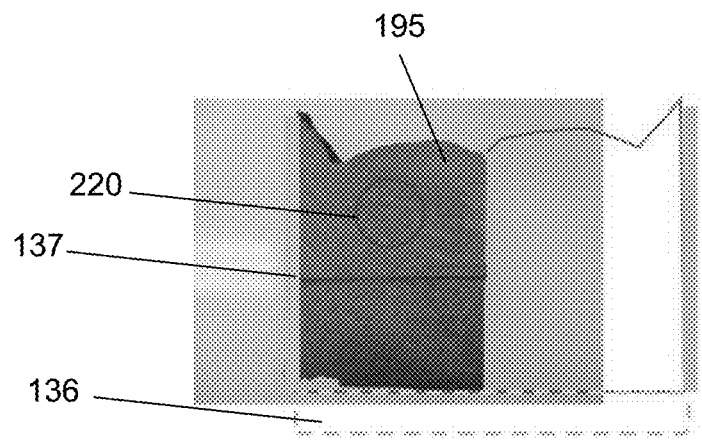
FIG. 2D is a cross-sectional image of a portion of a W-infused polycrystalline AlN ceramic in accordance with various embodiments of the invention.
Figure 2E:
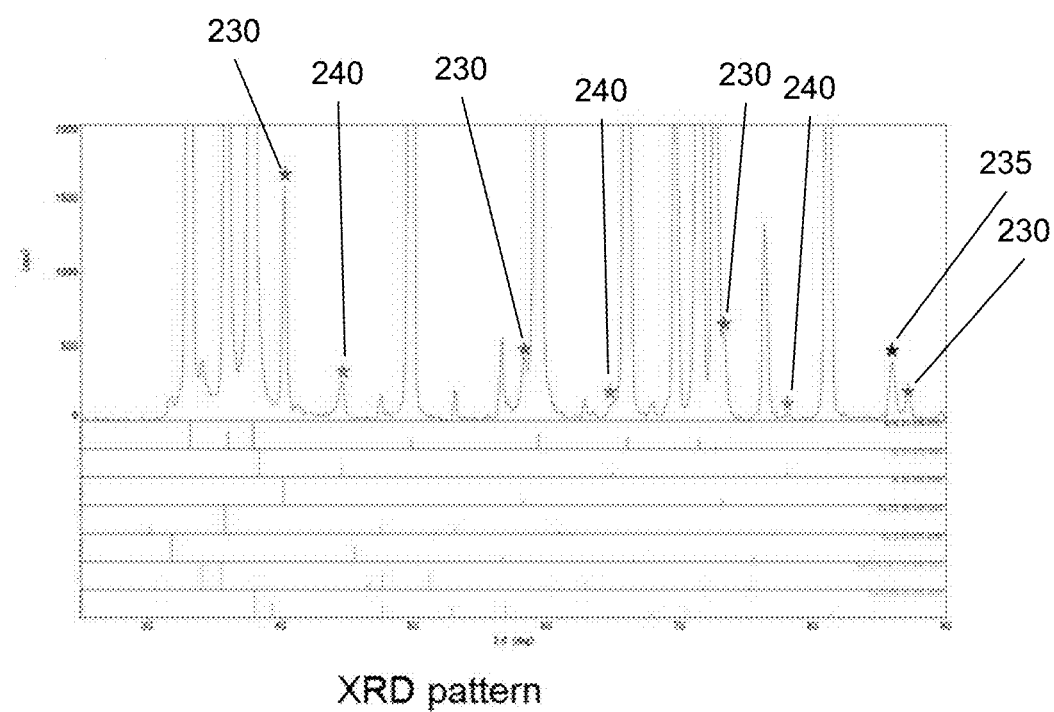
FIG. 2E is an x-ray diffraction scan of a W-infused polycrystalline AlN ceramic in accordance with various embodiments of the invention.

FIG. 2D is a cross-sectional image of a portion of a polycrystalline AlN ceramic 195 containing a W phase—flakes of W 220 are clearly evident in the bulk of the ceramic 195. In FIG. 2D, the locations of the W plug 136 and foil 137 utilized during the formation process are indicated, but the plug and at least a portion of the foil are typically removed before the ceramic is used for the formation of single-crystal W-infused AlN. FIG. 2E depicts an x-ray diffraction scan of the ceramic 195 of FIG. 2D. As shown, peaks 230 correlated with W and a peak 235 correlated with AlN (as well as peaks 240 correlated with Al) are clearly evident, indicating the presence of the W phase in the ceramic 195.

After the reaction cycle, crucible 130 (and the polycrystalline ceramic 195) may be cooled down to approximately room temperature at a positive nitrogen pressure (e.g., over a time period of approximately 1 hour). Thus formed, polycrystalline ceramic 195 includes, consists essentially of, or consists of AlN with a W phase therein. In an embodiment, an oxygen concentration (and/or concentration of other impurities such as boron or transition metals) of polycrystalline ceramic 195 is less than approximately 400 ppm by weight, and may even be less than approximately 100 ppm. In various embodiments, the oxygen concentration of polycrystalline ceramic 195, as measured by instrumental gas analysis (IGA), ranges from approximately $5.3 \times 10^{19}$ $cm^{-3}$ to approximately $6.1 \times 10^{19}$ $cm^{-3}$. In various embodiments, the carbon concentration of polycrystalline ceramic 195, as measured by IGA, ranges from approximately 230 ppm to approximately 280 ppm.

The main AlN phase of polycrystalline ceramic 195 typically includes, consists essentially of, or consists of AlN that is approximately stoichiometric, i.e., AlN that contains less than approximately 1% excess Al, less than approximately 0.5% excess Al, or even less than approximately 0.1% excess Al. After formation, polycrystalline ceramic 195 may be stored in an inert atmosphere.

Various embodiments of the present invention feature additional preparation of the polycrystalline AlN ceramic (having the W phase therewithin) that reduces or minimizes concentrations of contaminants such as carbon, as disclosed in U.S. patent application Ser. No. 16/185,830, filed on Nov. 9, 2018, U.S. patent application Ser. No. 16/185,832, filed on Nov. 9, 2018, U.S. patent application Ser. No. 16/444,147, filed on Jun. 18, 2019, and U.S. patent application Ser. No. 16/444,148, filed on Jun. 18, 2019, the entire disclosure of each of which is incorporated by reference herein. In various embodiments, the ceramic is broken up into fragments to facilitate removal of much of the carbon therefrom. The ceramic may be fragmented by, e.g., application of mechanical force. Much of the carbon present in the polycrystalline AlN ceramic remains on smaller fragments and/or dust (e.g., particles having large aggregate surface area and/or having diameters less than about 2 mm) resulting from the fragmentation process, while larger fragments (e.g., ones having widths, diameters, or other lateral dimensions ranging from 0.5 cm to 2 cm) exhibit smaller carbon concentrations. In various embodiments, the fragments of the AlN ceramic may be separated on the basis of size using one or more sieves, and/or compressed air or another fluid (e.g., nitrogen or an inert gas such as argon) may be applied to the fragments to minimize or reduce the amount of dust or other particles thereon.

In accordance with various embodiments of the invention, one or more of the larger fragments of the AlN polycrystalline ceramic, once separated from the smaller fragments and powder, may be utilized directly as the source material for formation of W-infused single-crystal AlN (as detailed below). In other embodiments, one or more (typically more) of the fragments are collected and placed into a crucible (e.g., a tungsten (W) vessel) for subsequent heat treatment. (While in preferred embodiments only the larger fragments of the polycrystalline AlN ceramic are heat treated, embodiments of the invention do encompass heat treatment of the entire, unfragmented ceramic, and/or heat treatment of fragments of the ceramic that include one or more of the smaller fragments.)

Figure 1A:
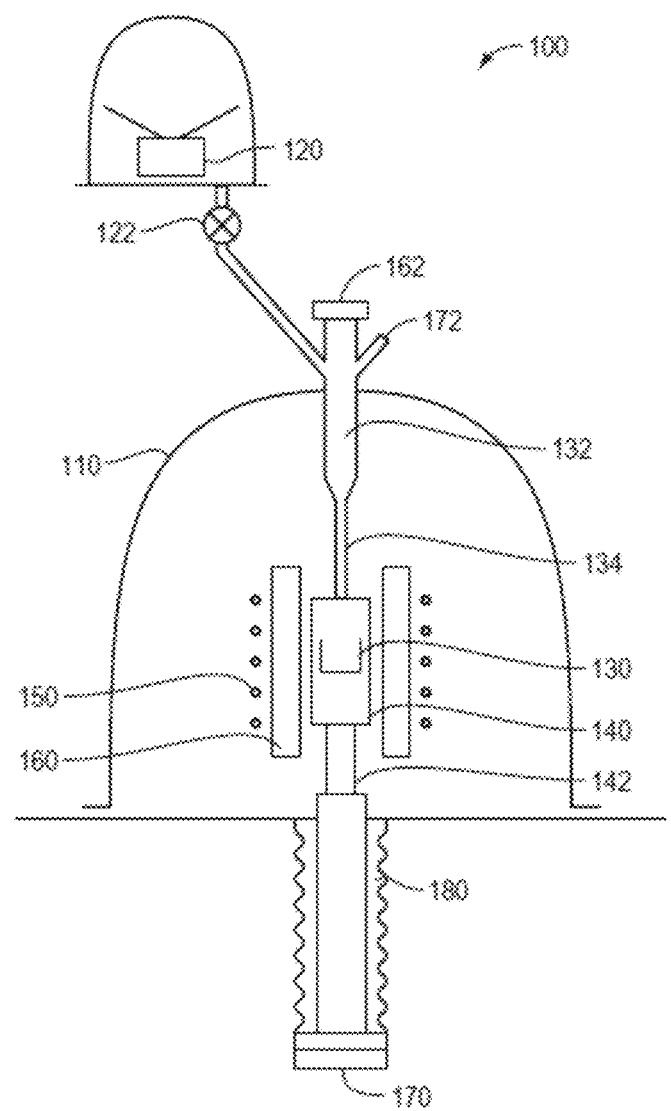
FIGS. 1A-1C are schematic diagrams of a reactor utilized for the formation of polycrystalline ceramic source material in accordance with various embodiments of the invention.
Figure 1B:
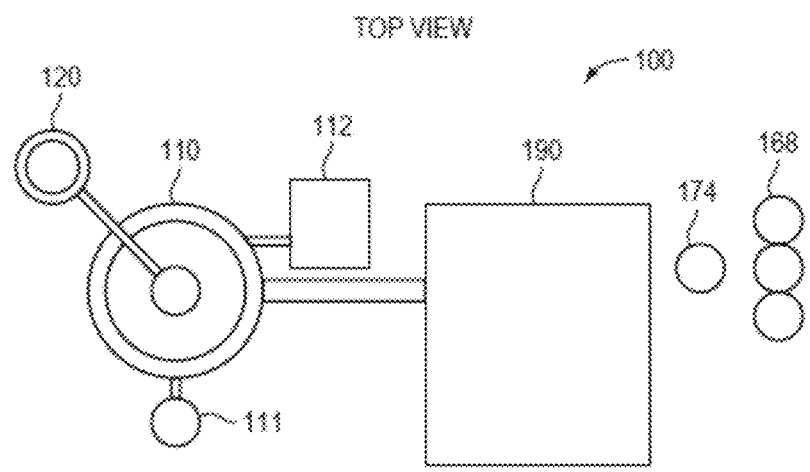
Figure 1C:
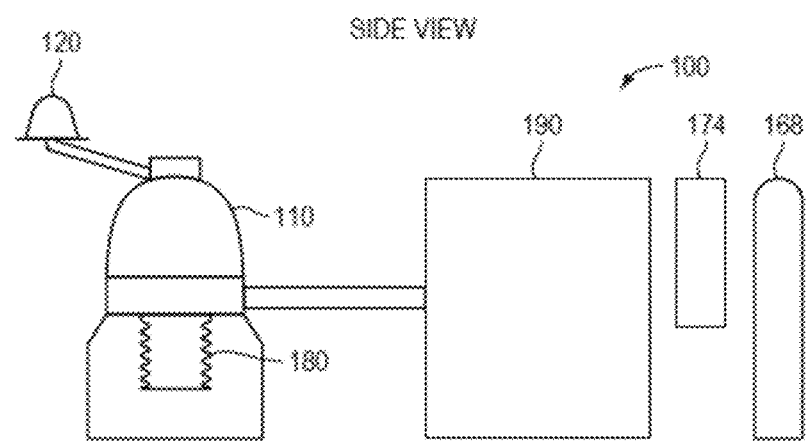
Figure 1D:
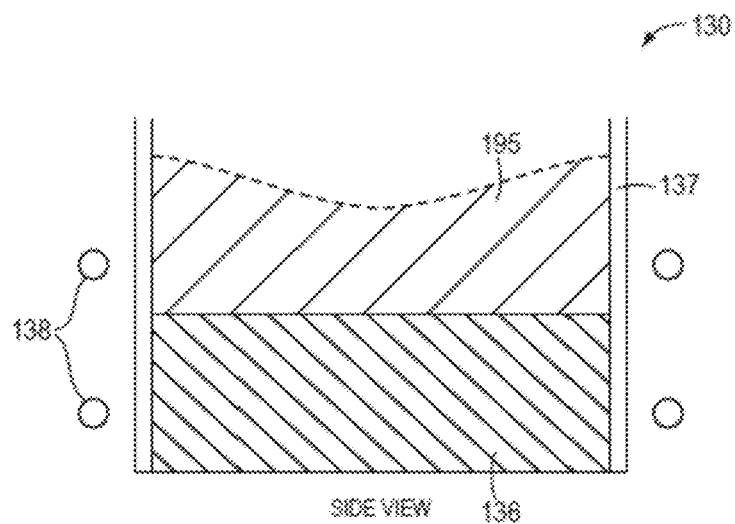
FIGS. 1D and 1E are schematic diagrams of a crucible utilized for the formation of polycrystalline ceramic source material in accordance with various embodiments of the invention.
Figure 1E:
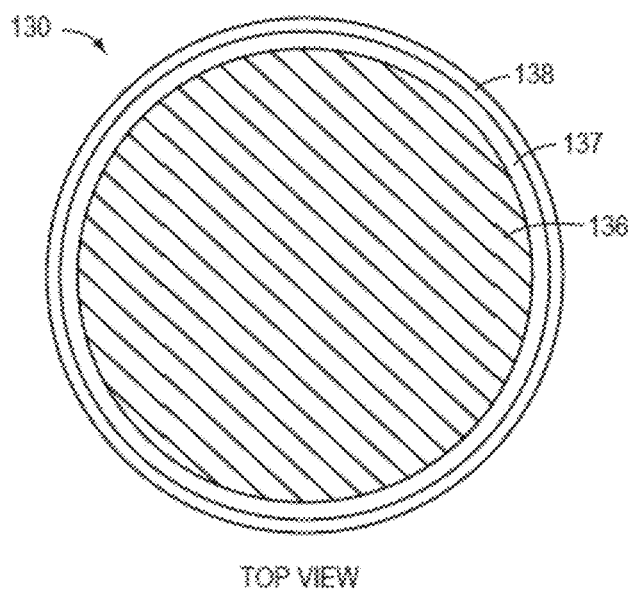
Figure 1G:
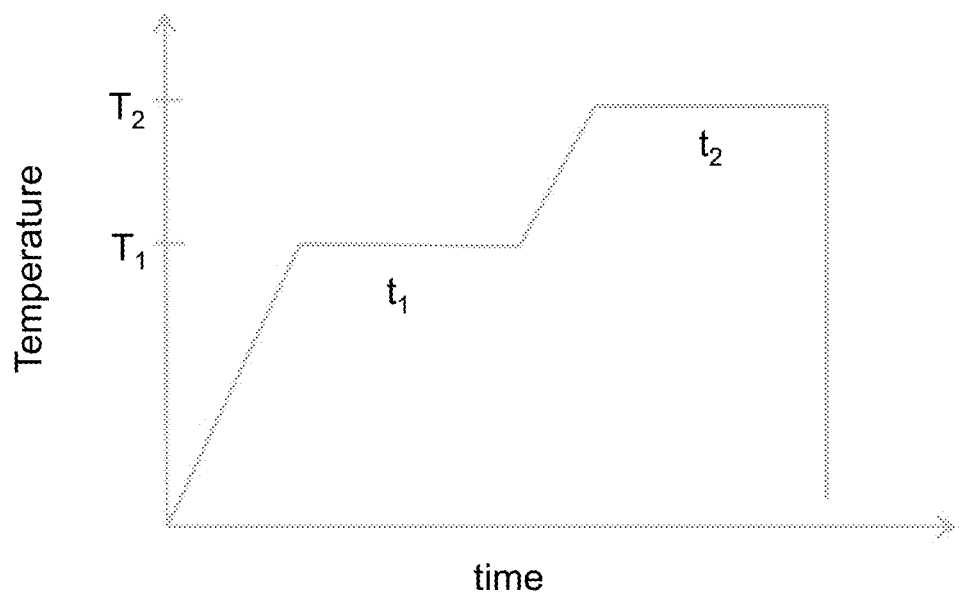
FIGS. 1G and 1H are graphs of example heat treatments for the optional densification of polycrystalline source material in accordance with various embodiments of the invention.

In various embodiments, the optional subsequent preparation stage involves an annealing and densification treatment of at least a portion of polycrystalline ceramic 195 (e.g., one or more larger fragments of the ceramic 195) to form high-quality polycrystalline AlN source material having a W phase therewithin. As shown in FIG. 1G, in accordance with various embodiments of the invention, the AlN ceramic (or portion thereof) may be heated to a first temperature T1 ranging from 1100° C. to 2000° C. and held at temperature T1 for a time period t1 of, for example, 2 hours to 25 hours. Thereafter, the ceramic (or portion thereof) may be heated to a higher second temperature T2 (e.g., a temperature ranging from 2000° C. to 2250° C.) and held at temperature T2 for a time period t2 of, for example, 3 hours to 15 hours. During the heat treatment, the ceramic (or portion thereof) is annealed and densified to form a polycrystalline AlN source material that may be utilized in the subsequent formation of W-infused single-crystal AlN bulk crystals. Because the AlN of the polycrystalline AlN source material is generally approximately stoichiometric AlN with low concentrations of non-W impurities, it may be used to form a W-infused AlN bulk crystal without further preparation (e.g., without intermediate sublimation-recondensation steps).

Figure 1H:
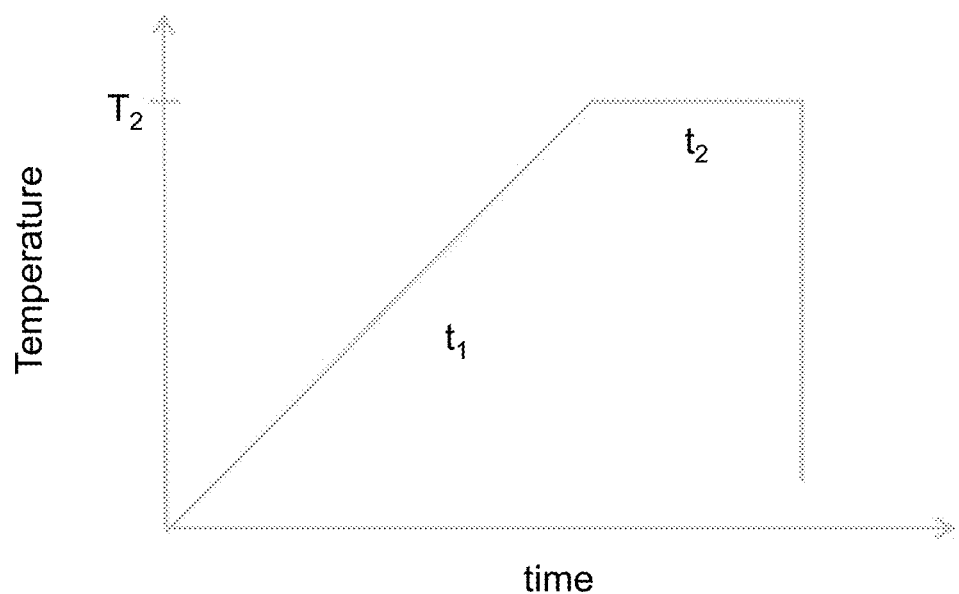

FIG. 1H schematically depicts an alternative to the heat treatment depicted in FIG. 1G in which a longer ramp to temperature T2 is utilized in place of the first annealing step at temperature T1. As shown in FIG. 1H, in accordance with various embodiments of the invention, the AlN ceramic (or portion thereof) may be ramped to temperature T2 (e.g., a temperature ranging from 2000° C. to 2250° C.) over a time period t1 ranging from, for example, 5 hours to 25 hours. Thereafter, the ceramic (or portion thereof) may be held at temperature T2 for a time period t2 of, for example, 3 hours to 25 hours. During the heat treatment, the ceramic (or portion thereof) is annealed and densified to form a polycrystalline AlN source material that may be utilized in the subsequent formation of high-quality W-infused single-crystal AlN bulk crystals. Because the AlN of the polycrystalline AlN source material is generally approximately stoichiometric AlN with low concentrations of non-W impurities, it may be used to form a W-infused AlN bulk crystal without further preparation (e.g., without intermediate sublimation-recondensation steps).

In various embodiments, the carbon concentration of the polycrystalline AlN source material, as measured by instrumental gas analysis (IGA), ranges from approximately $3.0 \times 10^{18}$ cm$^{-3}$ to approximately $1.8 \times 10^{19}$ cm$^{-3}$, approximately $3.8 \times 10^{18}$ cm$^{-3}$ to approximately $1.2 \times 10^{19}$ cm$^{-3}$, or even from approximately $3.0 \times 10^{18}$ cm$^{-3}$ to approximately $9.0 \times 10^{18}$ cm$^{-3}$. After the optional densification heat treatment, the density of the polycrystalline AlN source material, as measured by pycnometry at room temperature, may be approximately equal to that of single-crystal AlN, i.e., approximately 3.25 g/cm$^3$ to 3.26 g/cm$^3$. In various embodiments, the measured density of the AlN ceramic without the densification heat treatment may be lower, e.g., approximately 2.95 g/cm$^3$ to approximately 3.20 g/cm$^3$. In various embodiments, after the optional densification heat treatment, the polycrystalline AlN source material typically has an amber color and is composed of fairly large grains (e.g., average grain diameter ranging from approximately 0.1 mm to approximately 5 mm).

Figure 3:
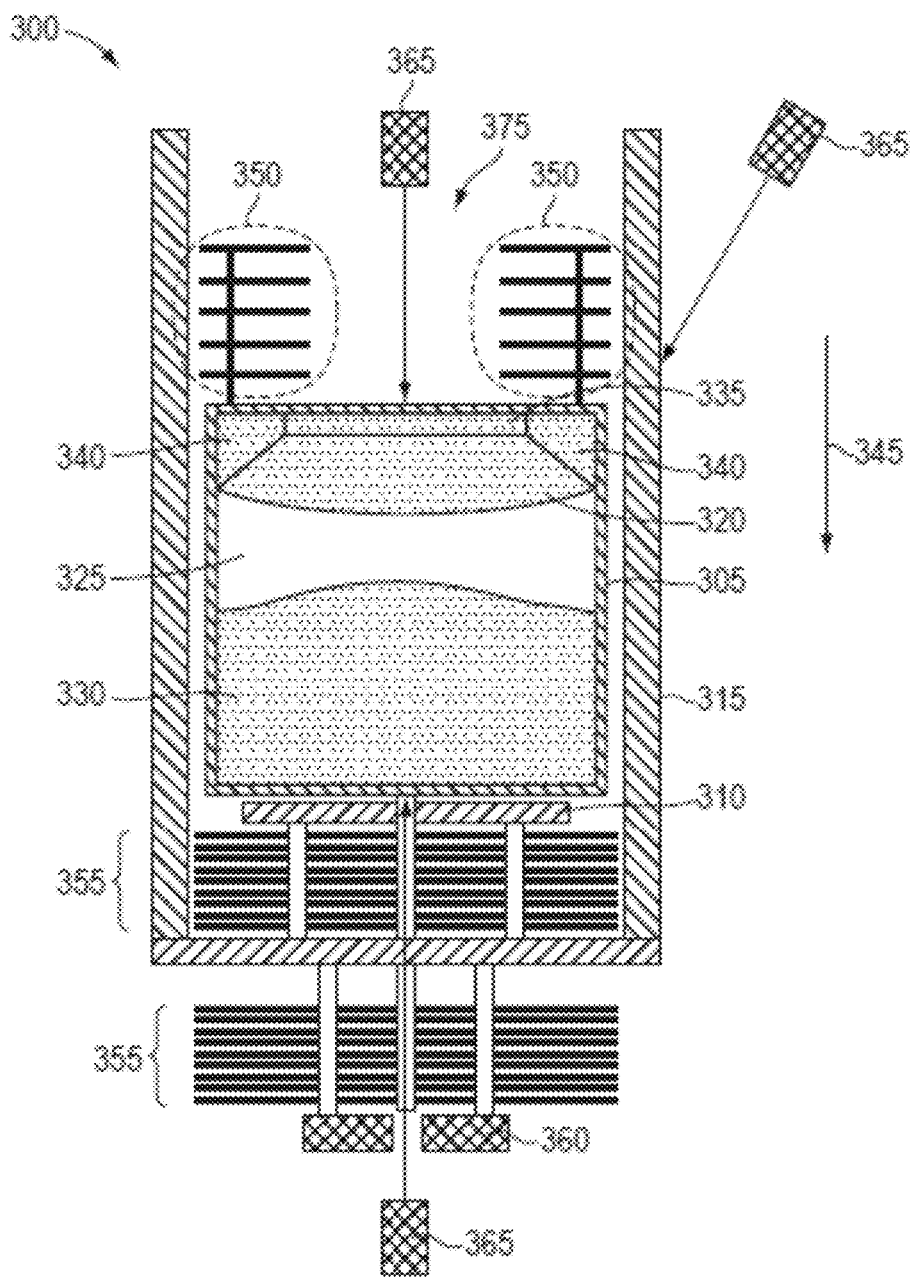
FIG. 3 is a schematic diagram of an apparatus for the growth of single-crystal AlN in accordance with various embodiments of the invention.

FIG. 3 depicts a crystal-growth apparatus 300 suitable for the growth of single-crystal AlN in accordance with various embodiments of the present invention. As shown, apparatus 300 includes a crucible 305 positioned on top of a crucible stand 310 within a susceptor 315. Both the crucible 305 and the susceptor 315 may have any suitable geometric shape, e.g., cylindrical. During a typical growth process, a W-infused AlN boule 320 is formed by condensation of a vapor 325 that includes or consists essentially of elemental precursors from the W-containing AlN boule 320, i.e., Al and N atoms and/or N$_2$ molecules. In typical embodiments, the vapor 325 arises from the sublimation of a source material 330, which may include, consist essentially of, or consist of the W-containing polycrystalline AlN source material described above. In various embodiments, the vapor 325 also contains W atoms and/or particulates, liberated from the source material 330, that form the W phase of the W-infused boule 320. The W-infused AlN boule 320 may form on and extend from a seed crystal 335. (Alternatively, the W-infused AlN boule 320 may nucleate upon and extend from a portion of the crucible 305 itself.) The seed crystal 335 may be a single crystal (e.g., a polished wafer) including, consisting essentially of, or consisting of AlN or W-infused AlN. In various embodiments, the seed crystal 335 has a diameter (or width or other lateral dimension) of at least approximately 10 mm, at least approximately 25 mm, at least approximately 35 mm, or even at least approximately 50 mm. In various embodiments, the seed crystal 335 has a diameter (or width or other lateral dimension) of approximately 150 mm or less, and W-infused single-crystal AlN grown therefrom has a diameter (or width or other lateral dimension) of approximately 150 mm or less. In various embodiments, the crystalline orientation of the seed crystal 335 is substantially parallel to the c-axis. In other embodiments, the crystalline orientation of the seed crystal 335 is at least approximately 5°, or even at least approximately 10° away from the c-axis; the orientation of the seed crystal 335 may be toward a non-polar direction.

The crucible 305 may include, consist essentially of, or consist of one or more refractory materials, such as tungsten, rhenium, and/or tantalum nitride. As described in the '135 patent and the '153 patent, the crucible 305 may have one or more surfaces (e.g., walls) configured to selectively permit the diffusion of nitrogen therethrough and selectively prevent the diffusion of aluminum therethrough.

In accordance with embodiments of the invention, one or more internal parts of the crystal-growth apparatus 300 (e.g., the crucible 305, the susceptor 315, and/or the crucible stand 310) may be annealed before crystal growth and formation of W-infused AlN boule 320, and such annealing may advantageously decrease the carbon concentration (and/or the oxygen concentration) in the W-infused AlN boule 320. In various embodiments, the one or more internal parts of the crystal-growth apparatus 300 may be annealed at, for example, a temperature ranging from approximately 1000° C. to approximately 1800° C. for a time period of approximately 5 hours to approximately 50 hours.

In various embodiments of the invention, the concentration of oxygen and/or carbon within the W-infused AlN boule 320 may be decreased via the introduction of one or more gettering materials within the crucible 305 prior to and during growth of the W-infused AlN boule 320. The gettering materials may be introduced as a portion or all of one or more of the components of the crystal-growth apparatus 300 (e.g., the crucible 305, a liner situated within the crucible 305 and proximate an interior surface or wall thereof, the susceptor 315, and/or the crucible stand 310), and/or the gettering materials may be introduced as discrete masses of material within the crystal-growth apparatus 300. The gettering materials may be disposed between the source material 330 and the growing W-infused AlN boule 320 in order to, e.g., getter or absorb contaminants such as carbon and/or oxygen from the vapor flowing toward the AlN boule 320 (i.e., toward the seed crystal 335). In various embodiments, the gettering materials are stable at and have melting points greater than the growth temperature (e.g., greater than approximately 2000° C.) and have low vapor pressures to prevent contamination of the growing AlN boule 220 with the gettering materials themselves. In various embodiments, a gettering material has a eutectic melting point with AlN that is greater than the growth temperature (e.g., greater than approximately 2000° C.). Examples of gettering materials in accordance with embodiments of the present invention include boron (melting point of approximately 2300° C.), iridium (melting point of approximately 2410° C.), niobium (melting point of approximately 2468° C.), molybdenum (melting point of approximately 2617° C.), tantalum (melting point of approximately 2996° C.), rhenium (melting point of approximately 3180° C.), and/or tungsten (melting point of approximately 3410° C.). In various embodiments, the gettering material (or the component of the apparatus 300 or portion thereof) may include, consist essentially of, or consist of one or more non-tungsten materials having melting temperatures of at least approximately 2300° C.

In various embodiments, TaC material may be utilized as a gettering material to reduce oxygen concentration in the W-infused AlN single crystal; TaC may advantageously convert $Al_2O$ within the crystal-growth apparatus 300 to CO gas that is stable at the growth temperature for the W-infused AlN boule 320. In various embodiments, tungsten (e.g., one or more W plates) may be utilized as a gettering material to reduce carbon concentration in the W-infused AlN boule 320; however, the presence of such W gettering materials is itself generally insufficient to form W-infused AlN boules as detailed herein.

In various embodiments, the gettering material may be supplemented with or replaced by the gettering behavior of the W metal liberated from the AlN source during growth of the W-infused AlN boule 320. Either during or after growth of the W-infused AlN boule 320, the W particulates that become part of the boule may getter contaminants such as carbon. Surprisingly, while at least some portion of such gettered contaminants may therefore also be present with the grown boule, they may be beneficially "deactivated," not forming scattering centers or impurity levels that deleteriously impact UV transparency of the W-infused boule 320.

As shown in FIG. 3, during formation of the W-infused AlN boule 320, a polycrystalline material 340 may form at one or more locations within the crucible 305 not covered by the seed crystal 335. However, the diameter (or other radial dimension) of the W-infused AlN boule 320 may expand, i.e., increase, during formation of the W-infused AlN boule 320, thereby occluding the regions of polycrystalline material 340 from impinging vapor 325 and substantially limiting or even eliminating their growth. As shown in FIG. 3, the diameter of the AlN boule 320 may expand to (or even start out at, in embodiments utilizing larger seed crystals 235) be substantially equal to the inner diameter of the crucible 305 (in which case no further lateral expansion of the W-infused AlN boule 320 may occur). The length of the AlN boule 320 depends on one or more factors such as the side of the crucible 305, the amount of polycrystalline source material present in the crucible 305, and/or the growth time. In various embodiments, the length of the W-infused AlN boule 300 may be at least 0.5 cm, at least 1 cm, at least 2 cm, at least 5 cm, at least 10 cm, at least 20 cm, or at least 50 cm.

The growth of the W-infused AlN boule 320 along a growth direction 345 typically proceeds due to a relatively large axial thermal gradient (e.g., ranging from approximately 5° C./cm to approximately 100° C./cm) formed within the crucible 305. A heating apparatus (not shown in FIG. 3 for clarity), e.g., an RF heater, one or more heating coils, and/or other heating elements or furnaces, heats the susceptor 315 (and hence the crucible 305) to an elevated temperature typically ranging between approximately 1800° C. and approximately 2300° C. Prior to the onset of growth, the crucible 305 and its contents (i.e., seed crystal 335, if present, and W-containing AlN source material 330) may be held at a temperature approximately equal to the desired growth temperature for a predetermined soak time (e.g., between approximately 1 hour and approximately 10 hours). In various embodiments, this soak at temperature stabilizes the thermal field within the crucible 305, promotes effective nucleation on the seed crystal 335, and promotes high-quality transition from nucleation to bulk growth of the W-infused single-crystalline AlN.

The apparatus 300 may feature one or more sets of top thermal shields 350, and/or one or more sets of bottom axial thermal shields 355, arranged to create the large axial thermal gradient (by, e.g., better insulating the bottom end of crucible 305 and the source material 330 from heat loss than the top end of crucible 305 and the growing W-infused AlN boule 320). During the growth process, the susceptor 315 (and hence the crucible 305) may be translated within the heating zone created by the heating apparatus via a drive mechanism 360 in order to maintain the axial thermal gradient near the surface of the growing W-infused AlN boule 320. One or more pyrometers 365 (or other characterization devices and/or sensors) may be utilized to monitor the temperature at one or more locations within susceptor 315. The top thermal shields 350 and/or the bottom thermal shields 355 may include, consist essentially of, or consist of one or more refractory materials (e.g., tungsten), and may be quite thin (e.g., between approximately 0.125 mm and 0.5 mm thick). As detailed in the '612 patent, the top thermal shields 350 and/or the bottom thermal shields 355 may be arranged in various configurations and/or have various characteristics (i.e., different numbers of shields, different spacings between shields, different thicknesses, different sized apertures defined therethrough, different sizes, etc.) in order to form a variety of different axial and radial thermal gradients within the crucible 305 and thus, the growth of the W-infused AlN boule 320 (e.g., the growth rate, the degree of radial expansion during growth, if any, etc.).

In various embodiments, the crucible 305 has a lid 370 with sufficient radiation transparency to enable at least partial control of the thermal profile within the crucible 305 via the arrangement of the top thermal shields 350. Furthermore, in embodiments featuring a seed crystal 335, the seed crystal 335 is typically mounted on the lid 370 prior to the growth of W-infused AlN boule 320. The lid 370 is typically mechanically stable at the growth temperature (e.g., up to approximately 2300° C.) and may substantially prevent diffusion of Al-containing vapor therethrough. Lid 370 generally includes, consists essentially of, or consists of one or more refractory materials (e.g., tungsten, rhenium, and/or tantalum nitride), and may be fairly thin (e.g., less than approximately 0.5 mm thick).

As shown in FIG. 3, each of the top thermal shields typically has an opening 375 therethrough. The opening 375 normally echoes the geometry and/or symmetry of the crucible 305 (e.g., the opening 375 may be substantially circular for a cylindrical crucible 305). The size of each opening 375 may be varied; typically, the size(s) range from a minimum of 10 mm to a maximum of approximately 5 mm (or even 2 mm) less than the diameter of the crucible 305.

For example, in an embodiment, five thermal shields 350, each having a diameter of 68.5 mm and an opening size (diameter) of 45 mm, are used. The thickness of each of the thermal shields 350 is 0.125 mm, and the thermal shields 350 are spaced approximately 7 mm from each other. At a typical growth temperature of 2065° C., this shield arrangement results in a radial thermal gradient (measured from the center of the semiconductor crystal to the inner edge of the crucible) of 27° C./cm. Other arrangements of thermal shields, above and/or below the crucible, may be utilized to achieve other radial thermal gradients by one of skill in the art without undue experimentation.

As shown in FIG. 3, the top thermal shields 350 may have openings 375 larger than any such opening present in the bottom thermal shields 355, and/or the top thermal shields 350 may be stacked with one or more spacings between shields that are larger than that between the various bottom thermal shields 355. The spacings may range between approximately 1 mm and approximately 20 mm, or even between approximately 7 mm and approximately 20 mm. Also as shown, the openings 375 in the top thermal shields 350 may all be substantially equal to each other. Depending upon the desired growth conditions (e.g., pressure, temperature, crucible dimensions, distance between the seed crystal and the source material, etc.), the number of top thermal shields 350, the spacing between shields 350, and/or the size of the openings 375 may be varied to form the desired radial thermal gradient. The radial thermal gradient may even be varied in real time (e.g., via control of the power supplied to, and resulting temperature of, all or one or more portions of the furnace or heating elements thereof) during the growth of W-infused AlN boule 320, e.g., in response to feedback based on determination of the radial thermal gradient during growth. For example, the radial thermal gradient may be determined based on the temperatures of lid 370 and one or more sides of crucible 315 (e.g., measured by pyrometers 365 as shown in FIG. 3).

Similarly, although each of the top thermal shields 350 may have a thickness less than 0.5 mm, the thickness of one or more of the shields 350 may be varied with respect to the others. For example, one or more top thermal shields 350 may have a thickness of approximately 0.25 mm while one or more others have a thickness of approximately 0.125 mm. The thickness of the top thermal shields 350 may even be varied as a function of distance away from the lid 370 (i.e., either increasing or decreasing). Such thermal shields 350 having different thicknesses may be utilized to adjust the thermal field above and within the crucible 315. For example, a thicker shield may be used to block more radiative heat flow but will typically have higher thermal impact at temperatures where the heat flux is dominated by the thermal conductivity (lower temperatures, e.g. <1500°-1800°). Therefore, the resultant radial thermal gradient may vary as a function of growth temperature, even with the same arrangement of the same top thermal shields 350.

After growth of the W-infused AlN boule 320, the W-infused AlN boule 320 may be cooled down to approximately room temperature for subsequent removal from the crystal-growth apparatus 300. For example, the W-infused AlN boule 320 may be cooled in a two-stage process as described in the '519 patent. However, in various embodiments of the invention, the W-infused AlN boule 320 may simply be cooled down from the growth temperature in a single stage, at an arbitrary rate, as the heat treatment detailed below (and in U.S. patents application Ser. Nos. 16/444,147 and 16/444,148, each filed on Jun. 18, 2019, the entire disclosure of each of which is incorporated by reference herein) obviates the need for the two-stage process of the '519 patent. In fact, in various embodiments of the present invention, the W-infused AlN boule 320 is cooled down from the growth temperature to approximately room temperature at a high rate (e.g., greater than 70° C./hour, greater than 80° C./hour, greater than 100° C./hour, greater than 150° C./hour, greater than 200° C./hour, greater than 250° C./hour, greater than 300° C./hour, greater than 400° C./hour, or even greater than 500° C./hour; in various embodiments, the rate may be no more than 2000° C./hour, 1500° C./hour, or 1000° C.) without any "controlled cooling" achieved via application of power to the heating elements of crystal-growth apparatus 300. In various embodiments of the invention, gas (e.g., nitrogen and/or an inert gas) is flowed within the crystal-growth apparatus 300 at a high rate (e.g., a rate approximately equal to or higher than any gas-flow rate utilized during crystal growth) in order to cool the W-infused AlN boule 320. For example, the gas-flow rate utilized during crystal growth may be approximately 4 slm or less, approximately 3 slm or less, approximately 2 slm or less, or approximately 1 slm or less. The gas-flow rate utilized during crystal growth may be approximately 0.1 slm or more, approximately 0.5 slm or more, approximately 1 slm or more, or approximately 2 slm or more. In various embodiments, the gas-flow rate utilized during cooling may be approximately 5 slm or more, approximately 10 slm or more, approximately 15 slm or more, approximately 20 slm or more, or approximately 25 slm or more. The gas-flow rate utilized during cooling may be approximately 30 slm or less, approximately 25 slm or less, approximately 20 slm or less, approximately 15 slm or less, or approximately 10 slm or less. In addition, in embodiments of the invention, the crucible 305 (and thus the W-infused AlN boule 320 therewithin) may be moved to an edge of the hot zone, or above the hot zone, formed by the heating elements of the crystal-growth apparatus 300 in order to more rapidly cool the W-infused AlN boule 320.

In various embodiments, the increased ductility (due to the incorporation of W particulates) of W-infused AlN boule 320 minimizes or eliminates the formation of cracks within the W-infused AlN boule 320, particularly when the W-infused AlN boule 320 has a diameter of approximately 50 mm or greater, even when the W-infused AlN boule 320 is cooled down at a rapid rate. However, the high cooling rate may also result in deleteriously high UV absorption within the W-infused AlN boule 320 at one or more wavelengths (e.g., wavelengths around approximately 310 nm), as detailed in U.S. patent Application Ser. Nos. 16/444,147 and 16/444,148.

After cooling to room temperature, the W-infused AlN boule 320, or a portion thereof, may be heat treated to further improve its UV transparency, particularly at deep-UV wavelengths. For example, one or more substrates (or "wafers") may be separated from W-infused AlN boule 320, as detailed further below, and one or more of the substrates may be heat treated for improvement of UV transparency. The ensuing description refers to the heat treatment of the W-infused AlN boule 320, but it should be understood that only one or more portions of the boule (e.g., one or more substrates) may be heat treated, rather than the entire boule. In addition, the heat treatments detailed herein may be performed on various different AlN crystals (e.g., AlN single crystals), even if not initially grown and cooled as detailed herein, in order to improve UV absorption.

In various embodiments of the invention, the W-infused AlN boule 320 is annealed in a heating apparatus (e.g., a furnace such as a resistive furnace or a radio-frequency (RF) furnace) configured for substantially isothermal or quasi-isothermal heating. The interior of the furnace (at least in the heated, or "hot" zone), as well as any hardware (e.g., a platform or other support) within the furnace, may include, consist essentially of, or consist of one or more refractory materials (e.g., W or another refractory metal) having a melting point exceeding about 2800° C., or even exceeding about 3000° C. In various embodiments, the interior of the furnace (at least in the heated, or "hot" zone), and the hardware (e.g., a platform or other support) within the furnace, may be free of carbon, carbon-based or carbon-containing materials, graphite, quartz, alumina, and/or molybdenum. Before the W-infused AlN boule 320 is placed within the furnace, the furnace may undergo a bake-out run at high temperature to reduce or minimize the presence of any contaminants therewithin. For example, the furnace may be heated to about 2600° C. under vacuum for a time period of, e.g., approximately 0.5 hours to approximately 2 hours. After the furnace has cooled, the W-infused AlN boule 320 may be placed within the furnace, which may then be filled with nitrogen gas at a pressure of, e.g., approximately 1 bar to approximately 2 bars. The W-infused AlN boule 320 may be placed "loosely" (i.e., not attached, adhered, or fastened to) on a platform within the furnace that may include, consist essentially of, or consist of W or another refractory metal. In various embodiments, the loose placement of the W-infused AlN boule 320 reduces or substantially eliminates stresses due to any differential thermal expansion between W-infused AlN boule 320 and the platform.

The temperature within the furnace may then be ramped to the desired annealing temperature at a ramp rate of, e.g., approximately 1° C./min to approximately 50° C./min. In various embodiments, the annealing temperature is between approximately 2100° C. and approximately 2500° C., e.g., approximately 2400° C. In various embodiments, the annealing temperature is between approximately 2150° C. and approximately 2400° C. The present inventors have found that lower annealing temperatures (e.g., about 2000° C.) are generally insufficient to improve the UV transparency of W-infused AlN boule 320 at deep-UV wavelengths to the desired level. Once the desired annealing temperature has been achieved, the W-infused AlN boule 320 is annealed at that temperature for a time period of, for example, approximately 0.5 hour to approximately 100 hours, approximately 0.5 hour to approximately 5 hours, or approximately 1 hour. After annealing, the temperature of the furnace is slowly ramped down to an intermediate temperature (for example, between approximately 800° C. and approximately 1200° C., e.g., approximately 1000° C.) at a rate ranging between approximately 60° C./hour and approximately 120° C./hour. For example, the furnace may be cooled from an exemplary annealing temperature of 2200° C. to 1000° C. over a time period of 15 hours. Such slow cooling may be achieved via controlled application of heat with the furnace (e.g., at low power levels). Thereafter, the furnace may be turned off, and the furnace and the W-infused AlN boule 320 may be allowed to cool to room temperature. Thus, in various embodiments of the invention, the entire annealing cycle, including the cool-down therefrom, of the W-infused AlN boule 320 is performed in substantially isothermal or quasi-isothermal conditions.

Figure 4A:
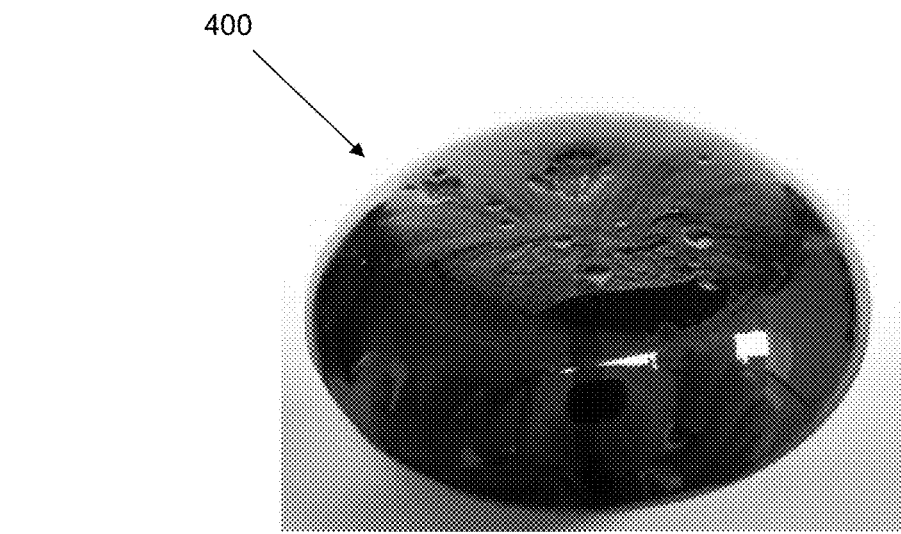
FIG. 4A depicts a W-infused single-crystalline AlN boule in accordance with various embodiments of the invention.

FIG. 4A depicts a W-infused single-crystalline AlN boule 400 grown as detailed herein in accordance with embodiments of the present invention. As detailed further below, the W-infused AlN boule 400 contains W precipitates in the form of polycrystalline particulates or balls, and/or crystalline (e.g., single-crystalline) inclusions. In various embodiments, the concentration of the polycrystalline particulates may range from (all values are by weight) approximately 1 ppm to approximately 500 ppm, approximately 1 ppm to approximately 200 ppm, approximately 1 ppm to approximately 110 ppm, approximately 20 ppm to approximately 500 ppm, approximately 20 ppm to approximately 200 ppm, approximately 20 ppm to approximately 110 ppm, approximately 50 ppm to approximately 500 ppm, approximately 50 ppm to approximately 200 ppm, or approximately 50 ppm to approximately 110 ppm. In various embodiments, the concentration of the crystalline inclusions may range from approximately 0 to approximately $10^4$ $cm^{-2}$, approximately 10 $cm^{-2}$ to approximately $10^4$ $cm^{-2}$, approximately 100 $cm^{-2}$ to approximately $10^4$ $cm^{-2}$, or approximately 1000 $cm^{-2}$ to approximately $10^4$ $cm^{-2}$. In various embodiments, the ratio of polycrystalline particulates to crystalline inclusions within the W-infused AlN boule may be increased via increasing the W content of the original W-infused polycrystalline ceramic utilized to form the boule.

As mentioned above, one or more substrates (or "wafers") may be separated from the W-infused AlN boule by the use of, e.g., a diamond annular saw or a wire saw. For example, the boule may be annealed as detailed above, and then substrates may be cut from it, or one or more substrates may be separated from the boule, and the substrates themselves may be annealed as detailed above. Embodiments of the invention also include W-infused boules and substrates that do not undergo additional annealing after crystal growth. In an embodiment, a crystalline orientation of a substrate thus formed may be within approximately 2° (or even within approximately 1°, or within approximately) 0.5° of the (0001) face (i.e., the c-face). Such c-face wafers may have an Al-polarity surface or an N-polarity surface, and may subsequently be prepared as described in U.S. Pat. No. 7,037,838, the entire disclosure of which is hereby incorporated by reference. In other embodiments, the substrate may be oriented within approximately 2° of an m-face or a-face orientation (thus having a non-polar orientation) or may have a semi-polar orientation if the W-infused AlN boule is cut along a different direction. The surfaces of these wafers may also be prepared as described in U.S. Pat. No. 7,037,838. The substrate may have a roughly circular cross-sectional area with a diameter of greater than approximately 50 mm. The substrate may have a thickness that is greater than approximately 100 µm, greater than approximately 200 µm, or even greater than approximately 2 mm. The substrate typically has the properties of W-infused AlN boule, as described herein. After the substrate has been cut from the W-infused AlN boule, one or more epitaxial semiconductor layers and/or one or more light-emitting devices, e.g., UV-emitting light-emitting diodes or lasers, may be fabricated over the substrate, for example as described in U.S. Pat. Nos. 8,080,833 and 9,437,430, the entire disclosure of each of which is hereby incorporated by reference.

Figure 4B:
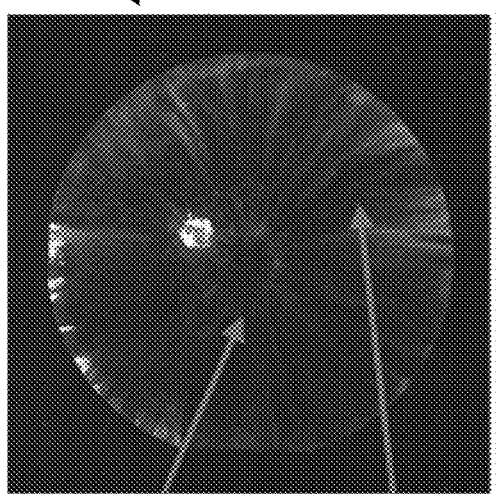
FIG. 4B depicts, in plan view, a W-infused AlN single-crystal substrate in accordance with various embodiments of the invention.

FIG. 4B depicts, in plan view, a W-infused AlN single-crystal substrate 405 prepared in accordance with embodiments of the present invention. As shown, the substrate 405 has an optical, "tree-like" pattern 410 thereon due at least in part to the W precipitates within and on the substrate. The diameter of the substrate 405 is approximately 2 inches. The white circular feature near the center of the substrate 405 of FIG. 4B is a polycrystalline inclusion. In various embodiments, the W concentration of a W-infused AlN substrate ranges between, for example, approximately 20 ppm and approximately 200 ppm, by weight. Without wishing to be bound by theory, in various embodiments of the invention, the tree-like pattern 410 of radial striations of the substrate may result from W material (e.g., atoms), which has a very low vapor pressure, being transported from the polycrystalline source to the boule during growth via attachment to Al atoms form the source material; subsequent migration of the W material on the surface of the growing boule may form the balls or precipitates, the distribution of which on and in the boule may follow the temperature distribution of the thermal field at the growing boule interface. In this manner, the precipitates or balls may form a tree-like pattern featuring a central (and approximately circular) collection with striations (or "branches") extending therefrom toward the edge of the boule or substrate.

Figure 4C:
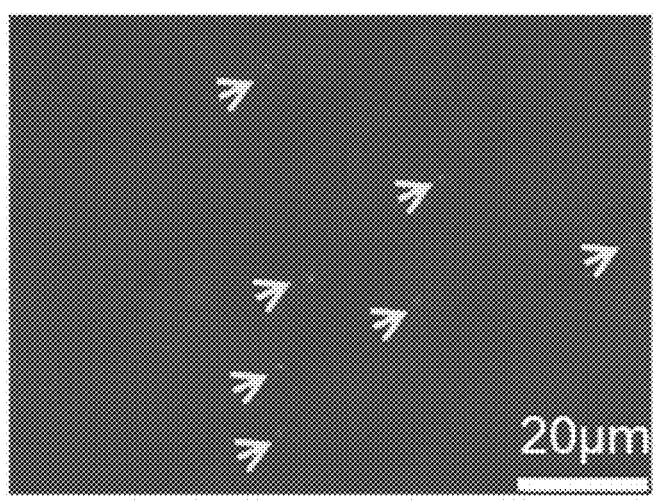
FIG. 4C is a plan-view image showing W particles (indicated by the arrows) on the surface of the substrate of FIG. 4B.

FIG. 4C is a plan-view image showing W particles (indicated by the arrows) on the surface of the substrate 405 of FIG. 4B. The density of the W particles in FIG. 4C, a portion of the substrate within the branches of the tree-like pattern, is approximately $7 \times 10^4$ cm$^{-2}$. In various embodiments, the density of the W particles may range from approximately $1 \times 10^4$ cm$^{-2}$ to approximately $1 \times 10^5$ cm$^{-2}$, or approximately $1 \times 10^3$ cm$^{-2}$ to approximately $1 \times 10^5$ cm$^{-2}$, or approximately $1 \times 10^2$ cm$^{-2}$ to approximately $1 \times 10^5$ cm$^{-2}$.

Figure 5A:
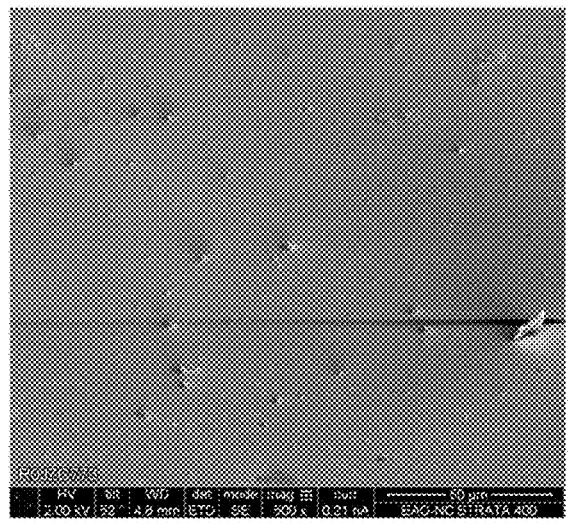
FIGS. 5A-5C are images, at different degrees of magnification, of W precipitates on the surface of a W-infused AlN single-crystal substrate in accordance with various embodiments of the invention.
Figure 5B:
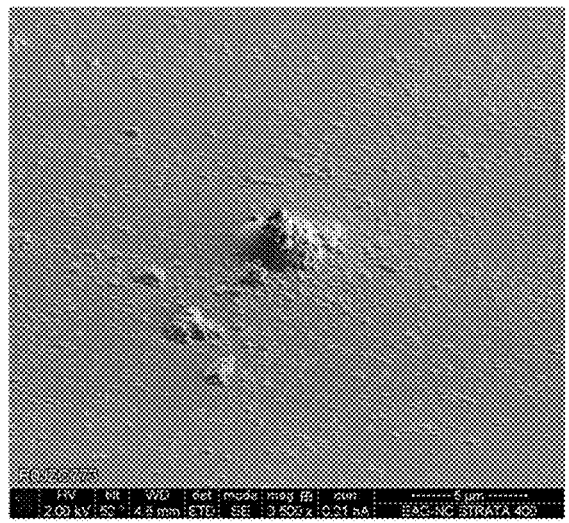
Figure 5C:
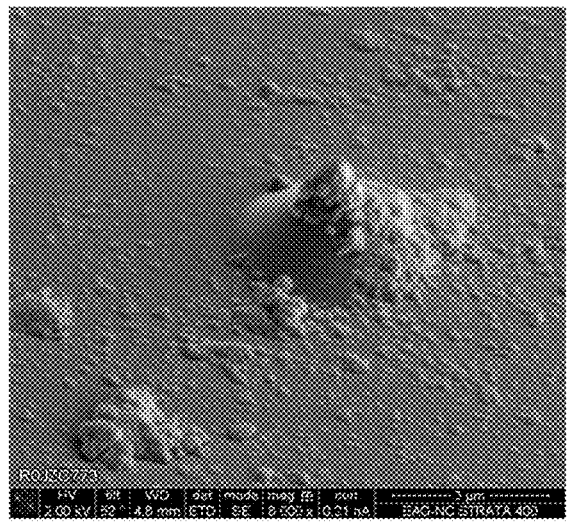

FIGS. 5A-5C are images, at different degrees of magnification, of W precipitates (or "balls") on the surface of a W-infused AlN single-crystal substrate prepared in accordance with embodiments of the present invention. Samples were prepared from the substrate by focused ion beam (FIB) milling after having protective coatings of C and/or Pt applied thereon. A cross-section was prepared using a FEI Strata 400 Dual-Beam FIB/SEM and thinned to electron transparency. The specimen was imaged with a Hitachi HD2300 STEM operated at 200 kV in high-angle annular dark-field (HAADF) and bright-field modes. X-ray spectra and maps were acquired using an Oxford EDS analysis x-ray detector.

Figure 6A:
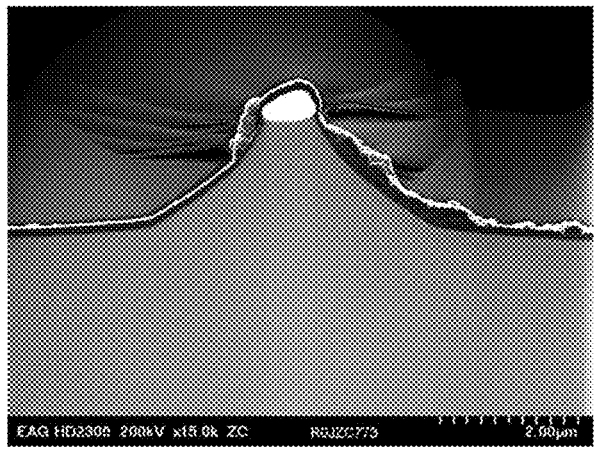
FIGS. 6A and 6B are cross-sectional electron micrographs of a W precipitate from the surface of a W-infused AlN substrate in accordance with various embodiments of the invention.
Figure 6B:
Figure 6C:
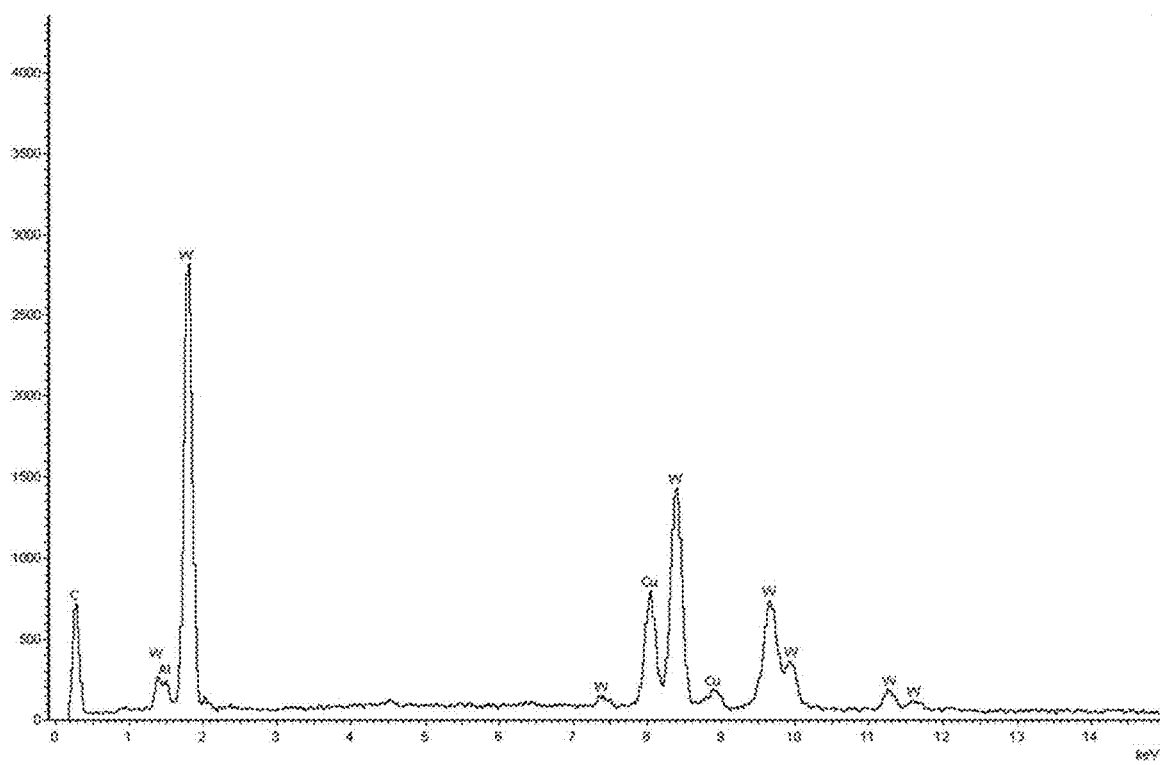
FIG. 6C is an x-ray spectrum of the W precipitate of FIGS. 6A and 6B, acquired at the point indicated on FIG. 6B.

FIGS. 6A and 6B show two of the resulting images of the W precipitate from the surface of the W-infused AlN substrate. (The W precipitate appears as quite elevated over the substrate surface mainly as a result of the sample preparation.) As shown, the diameter, or lateral dimension, of the particle is about 1 µm. In accordance with various embodiments of the invention, the diameter, or lateral dimension, of W precipitates on W-infused AlN substrate may range from approximately 0.1 µm to approximately 5 µm, or approximately 0.5 µm to approximately 5 µm, or approximately 0.5 µm to approximately 2 µm, or approximately 1 µm to approximately 2 µm. Surprisingly, there are no dislocations or other crystalline defects within the AlN substrate associated with the W precipitate. FIG. 6C is an x-ray spectrum of the W precipitate of FIGS. 6A and 6B, acquired at the point indicated on FIG. 6B. As shown, the peaks of the spectrum indicate that the particle is composed of W.

Figure 7A:
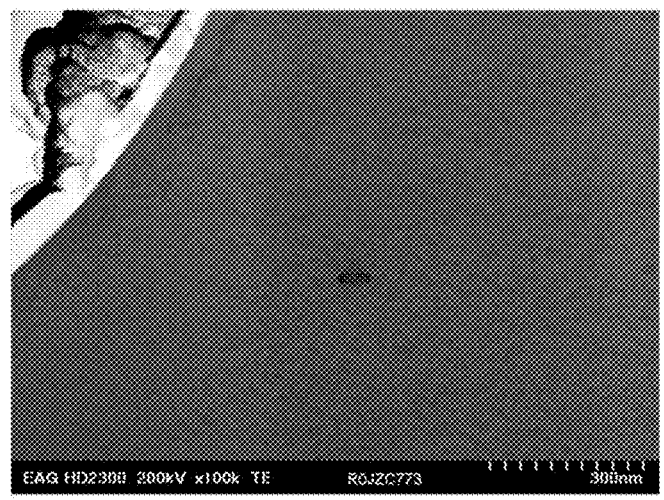
FIGS. 7A-7C are electron micrographs, at different degrees of magnification, of a W precipitate within a W-infused AlN substrate in accordance with various embodiments of the invention.
Figure 7B:
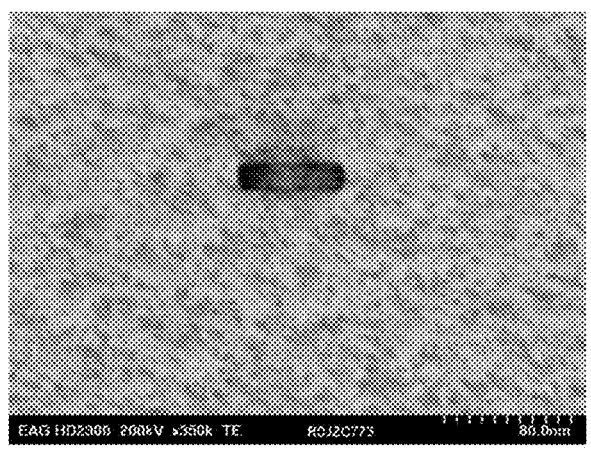
Figure 7C:
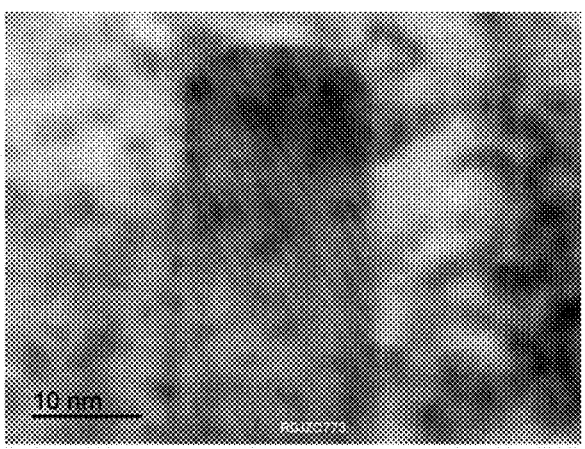

As mentioned above, W-infused AlN single crystals may also contain W precipitates within the bulk volume of the crystal, and these precipitates may be single-crystalline. FIGS. 7A-7C are STEM images of one such W precipitate from a substrate prepared in accordance with embodiments of the present invention. As shown, the imaged precipitate is about 40 nm in length and about 20 nm in width. The approximate depth of the precipitate is also about 20 nm. Regular crystallographic planes are clearly evident in FIG. 7C, indicating that the W precipitate is single-crystalline. In addition, surprisingly there are no dislocations or other crystalline defects associated with the W precipitate in the surrounding portion of the AlN substrate. In embodiments of the invention, the length of W precipitates in the bulk volume of the AlN single crystal may range from approximately 10 nm to approximately 80 nm, or approximately 20 nm to approximately 60 nm, or approximately 30 nm to approximately 50 nm. In embodiments of the invention, the width (and/or depth) of W precipitates in the bulk volume of the AlN single crystal may range from approximately 10 nm to approximately 50 nm, or approximately 15 nm to approximately 40 nm, or approximately 15 nm to approximately 30 nm.

Figure 7D:
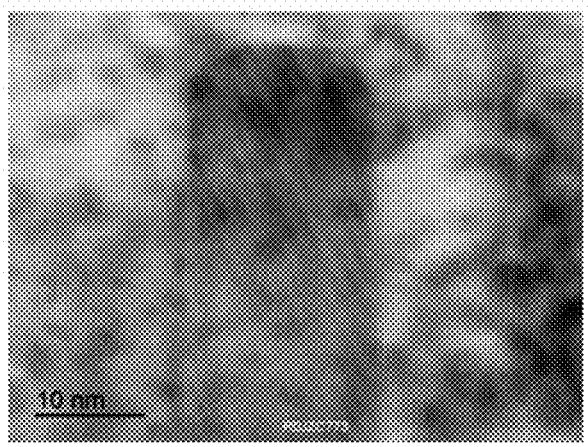
FIGS. 7D and 7E are high-resolution STEM images of the W precipitate of FIGS. 7A-7C, acquired under large-beam and small-aperture conditions to show diffraction contrast.
Figure 7E:
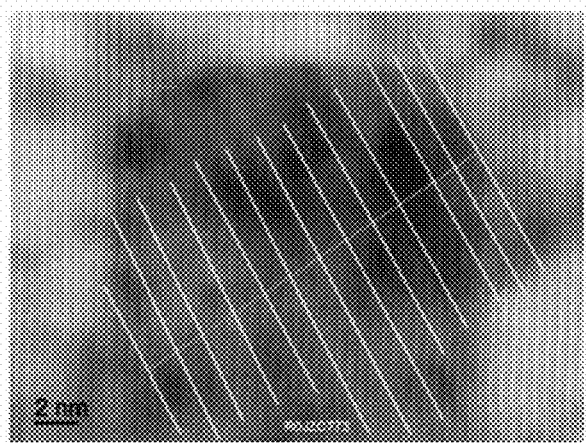

FIGS. 7D and 7E are high-resolution STEM images of the W precipitate of FIGS. 7A-7C, acquired under large-beam and small-aperture conditions to show diffraction contrast. The images reveal a moire pattern indicating the overlap of two different crystal structures. Using the spacing of the moire pattern, the lattice-spacing of the surrounding AlN, and the measured spacing of the precipitate in the image, it was found that the closest match for the lattice spacing of the precipitate was (011) W, indicating that the precipitate was indeed single-crystalline W.

Embodiments of the present invention enable the fabrication of crack-free W-infused AlN bulk single crystals having large diameters (e.g., diameters ranging from approximately 25 mm to approximately 150 mm, or even approximately 50 mm to approximately 150 mm) and any of a host of various beneficial characteristics in addition to high UV transparency. For example, W-infused AlN bulk crystals (e.g., boules and/or wafers) produced in accordance with embodiments of the present invention may have etch pit density measurements (i.e., etching measurements that reveal defects such as threading dislocations intersecting the surface of the crystal) ranging from approximately $5 \times 10^3$ cm$^{-2}$ to approximately $1 \times 10^4$ cm$^{-2}$. W-infused AlN crystals in accordance with embodiments of the present invention may have a density of threading edge dislocations ranging from approximately $1 \times 10^3$ cm$^{-2}$ to approximately $1 \times 10^4$ cm$^{-2}$ and a density of threading screw dislocations ranging from approximately 1 cm$^{-2}$ to approximately 10 cm$^{-2}$, e.g., a total threading dislocation density less than approximately $10^4$ cm$^{-2}$. When measured via x-ray diffraction, x-ray rocking curves (e.g., along (0002) and/or $(10^{-12})$) of W-infused AlN crystals in accordance with embodiments of the invention may have full width at half maximum (FWHM) values less than 50 arcsec (e.g., ranging from approximately 30 arcsec to approximately 50 arcsec, or from approximately 40 arcsec to approximately 50 arcsec). As measured by secondary ion mass spectroscopy (SIMS), W-infused AlN single crystals in accordance with embodiments of the invention may have carbon concentrations of approximately $1.8 \times 10^{16}$ cm$^{-3}$-$5 \times 10^{17}$ cm$^{-3}$, as well as oxygen concentrations of approximately $1 \times 10^{17}$ cm$^{-3}$-$7.9 \times 10^{17}$ cm$^3$. In various embodiments, the carbon concentration may range from approximately $1.8 \times 10^{16}$ cm$^{-3}$ to approximately $5 \times 10^{16}$ cm$^{-3}$. The thermal conductivity of W-infused AlN single crystals in accordance with embodiments of the invention may be greater than approximately 290 Watts per meter-Kelvin (W/m·K), as measured by the American Society for Testing and Materials (ASTM) Standard E1461-13 (Standard Test Method for Thermal Diffusivity by the Flash Method), the entire disclosure of which is incorporated by reference herein, and provided by a commercial vendor such as NETZSCH Inc. of Exton, Pennsylvania.

Figure 8A:
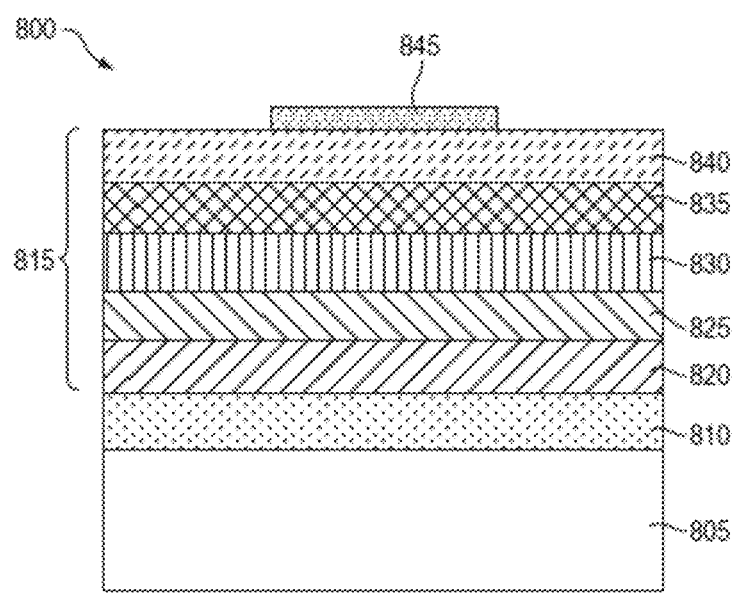
FIGS. 8A and 8B are schematic cross-sections of light-emitting devices in accordance with various embodiments of the invention.

W-infused single-crystal AlN substrates also enable the fabrication of high-performance light-emitting devices (e.g., light-emitting diodes (LEDs) and lasers), for example light-emitting devices configured to emit at UV wavelengths. FIG. 8A schematically depicts a light-emitting device structure 800 in accordance with embodiments of the present invention. Light-emitting device structures 800 in accordance with embodiments of the invention may include, consist essentially of, or consist of, for example, light-emitting diodes or lasers. As shown, the device structure 800 includes a substrate 805, which in various embodiments includes, consists essentially of, or consists of W-infused single-crystal AlN. In various embodiments, the substrate 805 may not be transparent (at least not fully transparent) to all radiation emitted by the device structure 800 (e.g., UV radiation), depending upon the wavelength(s) emitted by device structure 800. Substrate 805 may be miscut such that the angle between its c-axis and its surface normal is between approximately 0° and approximately 4°. In various embodiments, the misorientation of the surface of substrate 805 is less than approximately 0.3°, e.g., for substrates 805 that are not deliberately or controllably miscut. In other embodiments, the misorientation of the surface of substrate 805 is greater than approximately 0.3°, e.g., for substrates 805 that are deliberately and controllably miscut. In various embodiments, the direction of the miscut is towards the a-axis.

The surface of substrate 805 may have a group-III (e.g., Al—) polarity, and may be planarized, e.g., by chemical-mechanical polishing. The RMS surface roughness of substrate 805 may be less than approximately 0.5 nm for a 10 μm×10 μm area. In some embodiments, atomic-level steps are detectable on the surface when probed with an atomic-force microscope. The threading dislocation density of substrate 805 may be measured using, e.g., etch pit density measurements after a 5 minute KOH—NaOH eutectic etch at 450° C. In various embodiments, the threading dislocation density is less than approximately $2 \times 10^3$ cm$^{-2}$. In some embodiments substrate 805 has an even lower threading dislocation density. Substrate 805 may be topped with a homoepitaxial layer (not shown) that may include, consist essentially of, or consist of doped or undoped AlN.

The various layers of device structure 800 disposed over substrate 805 may be formed by any of a variety of different techniques, e.g., epitaxial growth techniques such as chemical vapor deposition (CVD) methods such as metalorganic CVD (MOCVD).

In accordance with embodiments of the invention, an optional release layer 810 may be disposed over the substrate 805 to facilitate later removal of all or a portion of the substrate 805 from the rest of device structure 800, for example as described in U.S. patent application Ser. No. 15/977,031, filed on May 11, 2018 (the '031 patent application), the entire disclosure of which is incorporated by reference herein. In various embodiments, the release layer 810 is substantially lattice-matched to the substrate 805. Minimizing the lattice mismatch between the release layer 810 and the substrate 805 advantageously reduces or eliminates, for example, cracking and/or defect introduction in the release layer 810 and island formation (i.e., three-dimensional growth) during growth of the release layer 810. (As used herein, a layer that is "substantially lattice-matched" to a substrate or another layer has an unstrained lattice parameter sufficiently close to that of the substrate or other layer to enable epitaxial growth of the layer thereover such that the layer is approximately lattice-relaxed, or tensilely or compressively strained without significant strain relaxation (e.g., less than 20% relaxation, or even less than 10% relaxation), and/or to enable epitaxial growth of the layer without introduction of cracks and/or defects (e.g., dislocations) at densities exceeding those, if any, present in the underlying substrate or layer.) In various embodiments, the lattice mismatch between the release layer 810 and the substrate 805 is less than ±5%, less than ±3%, less than ±2%, less than 1%, less than ±0.5%, less than ±0.2%, or less than ±0.1%. In various embodiments, it may be preferable to reduce the lattice mismatch when the release layer 810 is tensilely strained (i.e., the unstrained, innate in-plane lattice spacing of the release layer 810 is smaller than that of substrate 805) in order to minimize or eliminate stress-relieving cracking in the release layer 810. In various embodiments, when the release layer 810 is compressively strained, the lattice mismatch to the substrate 805 may be larger but may be a function of the thickness of release layer 810. For example, compressively strained release layers 810 having too much lattice mismatch to the substrate 805 and too large a thickness may island during layer growth. Thus, in various embodiments, a release layer 810 having a compressive lattice mismatch with substrate 805 of approximately 3% may have a thickness no more than approximately 10 nm. For layers with less lattice mismatch, the thickness may be larger.

In various embodiments, the release layer 810 includes, consists essentially of, or consists of AlN or AlGaN doped with one or more impurities that form an absorption band within the release layer 810 for a wavelength of light not strongly absorbed by the substrate 805 itself. For example, the release layer 810 may include, consist essentially of, or consist of AlN doped with oxygen, which has an absorption band at approximately 310 nm. Since an AlN substrate 805 does not strongly absorb light having wavelengths larger than approximately 300 nm, absorption of light within, and concomitant local heating of, the release layer 810 may be utilized to remove the substrate 805 from the device structure 800. In various embodiments, the release layer 810 may be doped with oxygen (O) and/or one or more other dopants, for example, carbon (C), iron (Fe), manganese (Mn), or gadolinium (Gd). Such dopants may be introduced (e.g., as an additional gaseous species) during epitaxial growth of the release layer 810. In other embodiments, some or all of the dopant may be introduced after epitaxial growth of at least a portion of the release layer 810 by techniques such as ion implantation or dopant diffusion (e.g., from a solid or gaseous source). In various embodiments of the invention, one or more of the dopants may be introduced into and/or present within the release layer 810 at a concentration of at least for example, approximately $10^{17}$ cm$^{-3}$, at least approximately $10^{18}$ cm$^{-3}$, or even at least $10^{19}$ cm$^{-3}$. In various embodiments of the invention, one or more of the dopants may be introduced into and/or present within the release layer 810 at a concentration of at most for example, approximately 1020 cm$^{-3}$, or at most approximately $10^{21}$ cm$^{-3}$.

In exemplary embodiments, a release layer 810 including, consisting essentially, or consisting of AlN doped with oxygen may exhibit an absorption band at a wavelength of approximately 310 nm, and a release layer 810 including, consisting essentially, or consisting of AlN doped with carbon may exhibit an absorption band at a wavelength of approximately 265 nm. In such embodiments, radiation for substrate separation may be applied via, for example, a KrF laser (emission wavelength of approximately 248 nm) or a XeCl laser (emission wavelength of approximately 308 nm).

In various embodiments, release layer 810 may include, consist essentially of, or consist of a semiconductor other than AlN (e.g., AlGaN), and which may contain one or more dopants forming one or more absorption bands for light that is not strongly absorbed by substrate 805. In various embodiments, the release layer 810 may include, consist essentially of, or consist of a nitride alloy containing one or more of boron, aluminum, gallium, and/or indium. The release layer 810 may even include, consist essentially of, or consist of silicon carbide or a metal nitride (in which the metal is, e.g., one or more of Sc, Y, La, Ti, or Ta). For example, a release layer 810 including, consisting essentially, or consisting of silicon carbide may exhibit an absorption band at a wavelength of approximately 376 nm, and a release layer 810 including, consisting essentially, or consisting of titanium nitride may exhibit an absorption band at a wavelength of approximately 365 nm. In various embodiments, the release layer 810 is substantially lattice-matched to substrate 805.

In various embodiments, multiple release layers 810 may be present within device structure 300, and each release layer 810 may have one or more absorption bands different from one or all absorption bands in the other release layer(s) 810. For example, multiple release layers 810 including, consisting essentially of, or consisting of AlN or AlGaN may be formed (e.g., epitaxially grown), where each release layer 810 is doped with a different one of the dopants referred to above. In various embodiments, one or more release layers 810 may be tensilely strained with respect to the substrate 805, and/or one or more release layers 810 may be compressively strained with respect to the substrate 805.

In various embodiments of the invention, release layer 810 is not present within the device structure 800. As detailed herein, substrates 805 prepared in accordance with embodiments of the invention may have beneficially low UV absorption coefficients. Thus, removal of all or a portion of the substrate 805 may be unnecessary for device structure 800 to exhibit surprisingly high performance and efficiency.

Device structure 800 also includes an active light-emitting structure 815 disposed over the release layer 810, if the release layer 810 is present, as shown in FIG. 8A. For example, the active structure 815 may include a bottom contact layer 820. In various embodiments, the bottom contact layer 820 is n-type doped, e.g., doped with an impurity such as P, As, Sb, C, H, F, O, Mg, and/or Si. The bottom contact layer 820 may include, consist essentially of, or consist of, for example, AlN or $Al_xGa_{1-x}N$. In an embodiment, an optional graded buffer layer (not shown) is disposed above substrate 805 and below bottom contact layer 820 (and, in various embodiments, below the release layer 810, if the release layer 810 is present). The graded buffer layer may include, consist essentially of, or consist of one or more semiconductor materials, e.g., $Al_xGa_{1-x}N$. In various embodiments, the graded buffer layer has a composition approximately equal to that of substrate 805 at the bottom interface of the graded buffer layer in order to promote two-dimensional growth and avoid deleterious islanding (such islanding may result in undesired elastic strain relief and/or surface roughening in the graded buffer layer and subsequently grown layers). The composition of the graded buffer layer at an interface with bottom contact layer 820 (or release layer 810, if present) may be chosen to be close to (e.g., approximately equal to) that of the desired active region of the device (e.g., the $Al_xGa_{1-x}N$ concentration that will result in the desired wavelength emission from the light-emitting device). In an embodiment, the graded buffer layer includes, consists essentially of, or consists of doped or undoped $Al_xGa_{1-x}N$ graded from an Al concentration x of approximately 100% to an Al concentration x ranging from approximately 60% to approximately 85%.

The bottom contact layer 820 may have a thickness sufficient to prevent current crowding after device fabrication and/or to stop on during etching to fabricate contacts. For example, the thickness of bottom contact layer 820 may range from approximately 100 nm to approximately 500 nm, or from approximately 100 nm to approximately 2 µm. When utilizing a bottom contact layer 820, the final light-emitting device may be fabricated with back-side contacts. In various embodiments, bottom contact layer 820 will have high electrical conductivity even with a small thickness due to the low defect density maintained when the layer is pseudomorphic. As utilized herein, a pseudomorphic film is one where the strain parallel to the interface between the film and an underlying layer or substrate is approximately that needed to distort the lattice in the film to match that of the substrate (or a relaxed, i.e., substantially unstrained, layer over the substrate and below the pseudomorphic film). Thus, the parallel strain in a pseudomorphic film will be nearly or approximately equal to the difference in lattice parameters between an unstrained substrate parallel to the interface and an unstrained epitaxial layer parallel to the interface.

Active structure 815 is configured for the emission of light in response to an applied voltage. Thus, the active structure 815 may include a multiple-quantum well ("MQW") layer 825 disposed above bottom contact layer 820. In various embodiments, MQW layer 825 is disposed directly on the bottom contact layer 820. In other embodiments, an optional layer (e.g., an undoped layer including, consisting essentially of, or consisting of an undoped semiconductor material such as AlGaN) may be disposed between the bottom contact layer 820 and the MQW layer 825. The MQW layer 825 may be doped with the same doping polarity as the bottom contact layer 820, e.g., n-type doped. The MQW layer 825 may include, consist essentially of, or consist of one or more quantum wells separated by (or surrounded on both sides by) barriers. For example, each period of MQW layer 825 may feature an $Al_xGa_{1-x}N$ quantum well and an $Al_yGa_{1-y}N$ barrier, where x is different from y. Typically, y is greater than 0.4 for light-emitting devices designed to emit light having a wavelength less than 300 nm and may be greater than 0.7 for shorter-wavelength emitters. It may even be greater than 0.9 for devices designed to emit at wavelengths shorter than 250 nm. The value of x will, at least in part, determine the emission wavelength of the device. For emission wavelengths longer than 280 nm, x may be as low as 0.2. For wavelengths between 250 nm and 280 nm, x may vary between 0.2 and 0.7. For wavelengths shorter than 250 nm, x may be greater than 0.6. In various embodiments, the difference between x and y is large enough to obtain good confinement of the electrons and holes in the active region, thus enabling high ratio of radiative recombination to non-radiative recombination. In an embodiment, the difference between x and y is approximately 0.25, e.g., x is approximately 0.5 and y is approximately 0.75. MQW layer 825 may include a plurality of such periods, and may have a total thickness ranging from 20 nm to 100 nm, or less than approximately 50 nm. In various embodiments of the invention, the active light-emitting structure 815 is configured to (e.g., has a MQW layer 825 having layer composition(s) selected to) emit ultraviolet light.

In various embodiments of the invention, an electron-blocking layer 830 may be disposed over MQW layer 825. The electron-blocking layer 830 typically has a wider band gap than that of a band gap within the MQW layer 825 (e.g., a band gap of the barrier layers therewithin). In various embodiments, the electron-blocking layer 830 may include, consist essentially of, or consist of e.g., $Al_xGa_{1-x}N$, and electron-blocking layer 830 may be doped. For example, the electron-blocking layer 830 may be doped with the same doping polarity as that of bottom contact layer 820 and/or MQW layer 825 (e.g., n-type doped). In various embodiments, the value of x in the electron-blocking layer 830 is greater than the value of the Al mole fraction in the barrier layers used in the MQW layer 825. For longer wavelength devices with emission wavelengths greater than 300 nm, x may be as low as 0.4 and may be greater than 0.7 for shorter wavelength devices. It may even be greater than 0.9 for devices designed to emit at wavelengths shorter than 250 nm. Electron-blocking layer 830 may have a thickness that may range, for example, between approximately 10 nm and approximately 50 nm, or even between approximately 10 nm and approximately 30 nm. In various embodiments of the invention, the electron-blocking layer 830 is sufficiently thin (e.g., thickness less than about 30 nm, or less than about 20 nm) so as to facilitate carrier (e.g., hole) tunneling through the electron-blocking layer 830. In various embodiments of the invention, the electron-blocking layer 830 is omitted from device structure 800.

As shown in FIG. 8A, device structure 800 may also include a graded layer 835 disposed above the electron-blocking layer 830 (or above the MQW layer 825 in embodiments in which electron-blocking layer 830 is omitted), and a cap layer (or "top contact layer") 840 may be disposed over the graded layer 835. The cap layer 840 may be doped with a doping polarity opposite of that of the bottom contact layer 820, e.g., p-type doped with one or more dopants such as Mg, Be, and/or Zn. In other embodiments, the cap layer 840 may be undoped, as carriers (e.g., holes) may be injected from an electrode into a two-dimensional carrier gas disposed at the interface between the cap layer 840 and the graded layer 835. (While in exemplary embodiments described herein the cap layer 840 is doped p-type and the bottom contact layer 820 is doped n-type, embodiments in which the doping polarities of these layers are switched are within the scope of the present invention; in such embodiments, the electron-blocking layer 830, if present, may be considered to be a "hole-blocking layer," as understood by those of skill in the art.) The cap layer 840 may have a thickness ranging from, e.g., approximately 1 nm to approximately 100 nm, or approximately 1 nm to approximately 50 nm, or approximately 1 nm to approximately 20 nm. In various embodiments, the cap layer 840 includes, consists essentially of, or consists of $Al_xGa_{1-x}N$, and in various embodiments the aluminum concentration x may range from 0 (i.e., pure GaN) to approximately 0.2.

The device structure 800 may also incorporate one or more metallic contacts to facilitate electrical contact to the device. For example, one metallic contact may include or consist essentially of an electrode layer 845 disposed above or on the cap layer 840. The composition and/or shape of the electrode layer 845 are not particularly limited as long as it enables the injection of carriers (e.g., holes) into the cap layer 840. In embodiments in which holes are injected into a p-type doped nitride-based semiconductor cap layer 840, the electrode layer 845 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). In embodiments in which electrons are injected into an n-type doped nitride-based semiconductor cap layer 840, the electrode layer 845 may include, consist essentially of, or consist of one or more metals, e.g., Ti, Al, Au, Pt, Ni, and/or V, alloys or mixtures of two or more of these metals, or oxide-based and/or transparent electrode materials such as indium tin oxide (ITO). Electrode layers 845 in accordance with embodiments of the invention are not limited to these materials. The thickness of the electrode layer 845 may be, for example, between approximately 10 nm and approximately 100 nm, or between approximately 10 nm and approximately 50 nm, or between approximately 10 nm and approximately 30 nm, or between approximately 25 nm and approximately 40 nm. In various embodiments, the electrode layer 845 is formed after removal of all or a portion of the substrate 805.

Figure 8B:
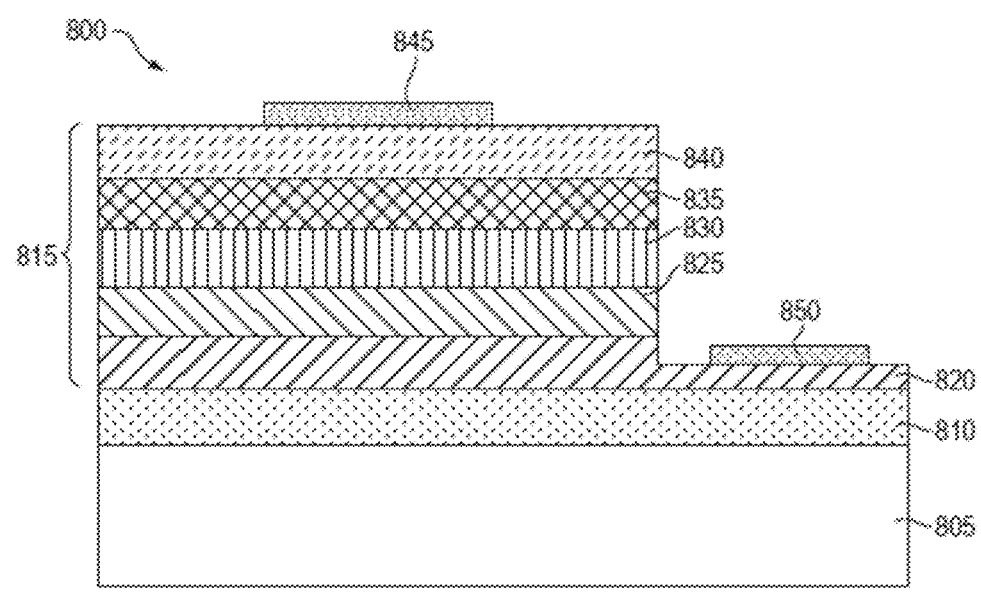

In various embodiments, a second electrode layer 850 may be formed in electrical contact with (and, in various embodiments, direct mechanical contact with) the bottom contact layer 820, even if the substrate 805 is not removed, as shown in FIG. 8B; such an electrode layer 850 may be considered to be a "bottom electrode layer." For example, a portion of the active structure 815 may be removed by, e.g., conventional photolithography and wet and/or dry etching, in order to reveal at least a portion of the bottom contact layer 820. The second electrode layer 850 may then be deposited on the bottom contact layer. The composition and/or shape of the bottom electrode layer 850 are not particularly limited as long as it enables the injection of carriers (e.g., electrons) into the bottom contact layer 820. In embodiments in which electrons are injected into an n-type doped nitride-based semiconductor bottom contact layer 820, the bottom electrode layer 850 may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO). In embodiments in which holes are injected into a p-type doped nitride-based semiconductor bottom contact layer 820, the bottom electrode layer 850 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Bottom electrode layers 850 in accordance with embodiments of the invention are not limited to these materials. The thickness of the bottom electrode layer 850 may be, for example, between approximately 10 nm and approximately 100 nm, or between approximately 10 nm and approximately 50 nm, or between approximately 10 nm and approximately 30 nm, or between approximately 25 nm and approximately 40 nm.

As mentioned above, embodiments of the present invention feature a graded layer 835 disposed between the cap layer 840 and the electron-blocking layer 830 (or the MQW layer 815 in embodiments in which the electron-blocking layer 830 is omitted). The graded layer 835 typically includes, consists essentially of, or consists of a nitride semiconductor, e.g., a mixture or alloy of Ga, In, and/or Al with N. The compositional gradient within graded layer 835 may be substantially continuous or stepped, and the grading rate within the graded layer 835 may be substantially constant or may change one or more times within the thickness of graded layer 835. The graded layer 835 may be undoped. In other embodiments, the graded layer 835 is doped n-type or p-type with one or more dopants, e.g., C, H, F, O, Mg, Be, Zn, and/or Si. The thickness of the graded layer 835 may be, for example, between approximately 5 nm and approximately 100 nm, between approximately 10 nm and approximately 50 nm, or between approximately 20 nm and approximately 40 nm. In various embodiments, the epitaxial growth process utilized to form the various layers of the device structure 800 may be temporarily halted between growth of the graded layer 835 and the underlying layer and/or the overlying layer. In various embodiments, the graded layer 835 is pseudomorphically strained to one or more of the underlying layers and/or to the substrate 805.

In various embodiments of the invention, one or more (or even all) of the layers of device structure 800 formed over substrate 805 may be pseudomorphically strained, similar to device layers described in U.S. Pat. No. 9,437,430, filed on Jan. 25, 2008, U.S. Pat. No. 8,080,833, filed on Apr. 21, 2010, and U.S. Pat. No. 9,299,880, filed on Mar. 13, 2014, the entire disclosure of each of which is incorporated by reference herein. Thus, as detailed therein, in various embodiments, one or more of the layers of device structure 800 may be pseudomorphic and may have a thickness greater than its predicted (e.g., via the Maxwell-Blakeslee theory) critical thickness. Moreover, the collective layer structure of device structure 800 may have a total thickness greater than the predicted critical thickness for the layers considered collectively (i.e., for a multiple-layer structure, the entire structure has a predicted critical thickness even when each individual layer would be less than a predicted critical thickness thereof considered in isolation). In other embodiments, one or more layers of device structure 800 are pseudomorphically strained and cap layer 840 is partially or substantially fully relaxed. For example, the lattice mismatch between cap layer 840 and substrate 805 and/or MQW layer 835 may be greater than approximately 1%, greater than approximately 2%, or even greater than approximately 3%. In an exemplary embodiment, cap layer 840 includes, consists essentially of, or consists of undoped or doped GaN, substrate 805 includes, consists essentially of, or consists of doped or undoped single-crystalline AlN, and MQW layer 825 includes, consists essentially of, or consists of multiple $Al_{0.55}Ga_{0.45}N$ quantum wells interleaved with $Al_{0.75}Ga_{0.25}N$ barrier layers, and cap layer 840 is lattice mismatched by approximately 2.4%. Cap layer 840 may be substantially relaxed, i.e., may have a lattice parameter approximately equal to its theoretical unstrained lattice constant. A partially or substantially relaxed cap layer 840 may contain strain-relieving dislocations having segments threading to the surface of cap layer 840 (such dislocations may be termed "threading dislocations"). The threading dislocation density of a relaxed cap layer 840 may be larger than that of substrate 805 and/or layers underlying cap layer 840 by, e.g., one, two, or three orders of magnitude, or even more.

In accordance with embodiments of the present invention, application of light (e.g., laser light) and/or heat may be utilized to separate all or a portion of the substrate 805 from the rest of device structure 800, as detailed in the '031 patent application. Before such substrate separation, the device structure 800 may be attached to a handle wafer (not shown) by, for example, wafer bonding or an adhesive material. In various embodiments, the device structure 800 may be wafer bonded to the handle wafer via use of an intermediate material such as, for example, photoresist (e.g., SU-8), glass frit, an organic material such as benzocyclobutene (BCB), etc. Wafer bonding techniques, including reversible ones (i.e., techniques in which the handle wafer is straightforwardly removed after bonding and processing) are known to those of skill in the art and may be accomplished without undue experimentation. The handle wafer may be at least substantially transparent to light emitted by the active structure 815 and/or to light utilized to separate substrate 805 (e.g., via absorption within release layer 810). The handle wafer may include, consist essentially of, or consist of, for example, one or more semiconductor materials, sapphire, quartz, etc. For substrate separation, heat and/or light having a wavelength corresponding to an absorption band within release layer 810 (e.g., approximately 310 nm for oxygen-doped AlN) may be emitted into the device structure 800 (e.g., from below the substrate 805 and/or from one or more sides of the bonded structure). (As utilized herein, a wavelength "corresponding to" an absorption band is sufficiently close to the absorption band such that an amount of the light sufficient to effect at least partial release of an underlying substrate and/or layer is absorbable within the layer having the absorption band.) In various embodiments, the light is primarily composed of or contains a wavelength that is within ±20 nm, within ±10 nm, within ±5 nm, within ±2 nm, or within ±1 nm of the wavelength of an absorption band within the release layer 810. In various embodiments, the release layer 810 may have more than one absorption band (due to, e.g., introduction of two or more different dopants), and the light may be primarily composed of or contain one or more wavelengths that are within ±20 nm, within ±10 nm, within ±5 nm, within ±2 nm, or within ±1 nm of the wavelength of one or more of the absorption bands within the release layer 810. Absorption of the light and/or heat within the release layer 810 results in local heating within the release layer 810, which may be magnified for release layers 810 having lower thermal conductivity. The local heating results in crack formation and subsequent fracture within the release layer 810 and/or at the interface between release layer 810 and substrate 805, thereby removing the substrate 805 (or at least a portion thereof) from device structure 800. In various embodiments of the invention, the light may be applied at a fluence ranging from, for example, approximately 500 mJ/cm$^2$ to approximately 1000 mJ/cm$^2$. In various embodiments of the invention, the light may be applied as one or more pulses. Such pulses may have durations ranging from, for example, approximately 10 ms to approximately 100 ms.

In various embodiments, at least a portion of the release layer 810 remains attached to the device structure 800 upon removal of the substrate 805. After removal of the substrate 805, any remaining portion of the release layer 810 may be removed (e.g., by selective etching or grinding and/or polishing). A metallic contact may be formed in contact with the bottom contact layer 820, and the device structure 800 may be utilized to emit light without absorption thereof by substrate 805. The metallic contact may be formed on the "bottom" surface of the bottom contact layer 820 (i.e., the surface of the bottom contact layer 820 opposite the top contact layer), or a portion of the structure may be etched away so that the metallic contact may be formed on a thusly revealed "top" surface of the bottom contact layer (i.e., the surface of the bottom contact layer 820 opposite the prior location of substrate 805). In various embodiments, any handle wafer used in the substrate-separation process is removed from the device structure 800, while in other embodiments, the handle wafer remains attached to the device structure 800.

Figure 9A:
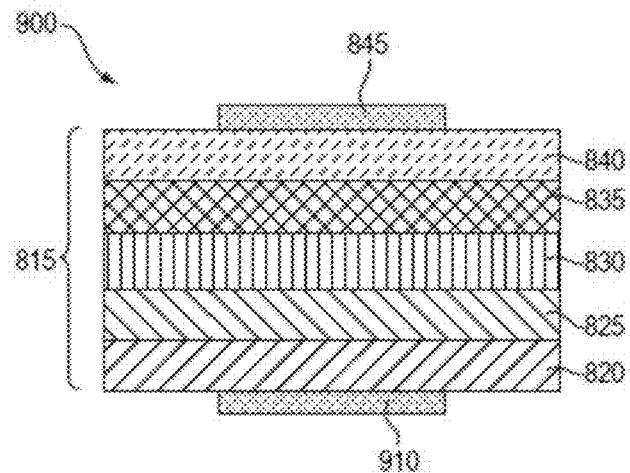
FIGS. 9A and 9B are schematic cross-sections of light-emitting devices after substrate removal in accordance with various embodiments of the invention.
Figure 9B:
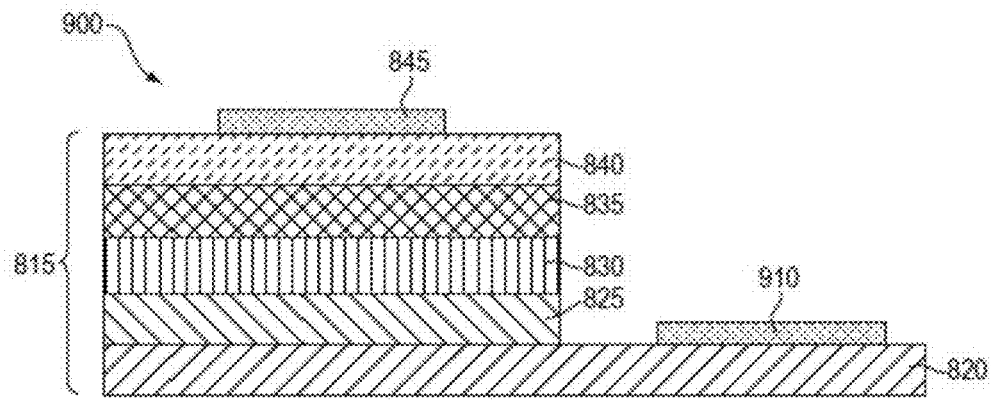

As mentioned, after removal of all or a portion of the substrate 805, electrical contacts may be made to the bottom contact layer 820 and the cap layer 840 so that power may be applied to the device structure 800, resulting in light emission therefrom. FIGS. 9A and 9B depict different device structures 900 in accordance with various embodiments, in which a bottom electrode layer 910 is formed below the newly exposed bottom contact layer 820 after removal of the substrate 805 (FIG. 9A) and on top of a portion of bottom contact layer 820 after removal of the substrate 805 and masking and removal of a portion of the active structure 815 (FIG. 9B). The composition and/or shape of the bottom electrode layer 910 are not particularly limited as long as it enables the injection of carriers (e.g., electrons) into the bottom contact layer 820. In embodiments in which electrons are injected into an n-type doped nitride-based semiconductor bottom contact layer 820, the bottom electrode layer 910 may include, consist essentially of, or consist of one or more metals such as one or more metals, e.g., Ti, Al, Au, Pt, Ni, and/or V, alloys or mixtures of two or more of these metals, or oxide-based and/or transparent electrode materials such as indium tin oxide (ITO). In embodiments in which holes are injected into a p-type doped nitride-based semiconductor bottom contact layer 820, the bottom electrode layer 910 may include, consist essentially of, or consist of one or more metals having large work functions, e.g., Ni, Au, Pt, Ag, Rh, and/or Pd, alloys or mixtures of two or more of these metals, or oxide-based and/or transparent electrode materials such as indium tin oxide (ITO). Bottom electrode layers 910 in accordance with embodiments of the invention are not limited to these materials. The thickness of the bottom electrode layer 910 may be, for example, between approximately 10 nm and approximately 100 nm, or between approximately 10 nm and approximately 50 nm, or between approximately 10 nm and approximately 30 nm, or between approximately 25 nm and approximately 40 nm.

After formation of the electrodes 845 and/or 910, the resulting light-emitting device may be electrically connected to a package, for example as detailed in U.S. Pat. No. 9,293,670, filed on Apr. 6, 2015 (the '670 patent), the entire disclosure of which is incorporated by reference herein. A lens may also be positioned on the device to transmit (and, in various embodiments, shape) the light emitted by the device. For example, a rigid lens may be disposed over the device as described in the '670 patent or in U.S. Pat. No. 8,962,359, filed on Jul. 19, 2012, or in U.S. Pat. No. 9,935,247, filed on Jul. 23, 2015, the entire disclosure of each of which is incorporated by reference herein. After packaging, any handle wafer remaining on the active structure 815 may be removed.

In accordance with embodiments of the invention, other techniques for partial or complete substrate removal may be utilized if desired. For example, etching techniques, such as electrochemical etching techniques described in U.S. patent application Ser. No. 16/161,320, filed on Oct. 16, 2018, the entire disclosure of which is incorporated by reference herein, may be utilized.

Figure 10A:
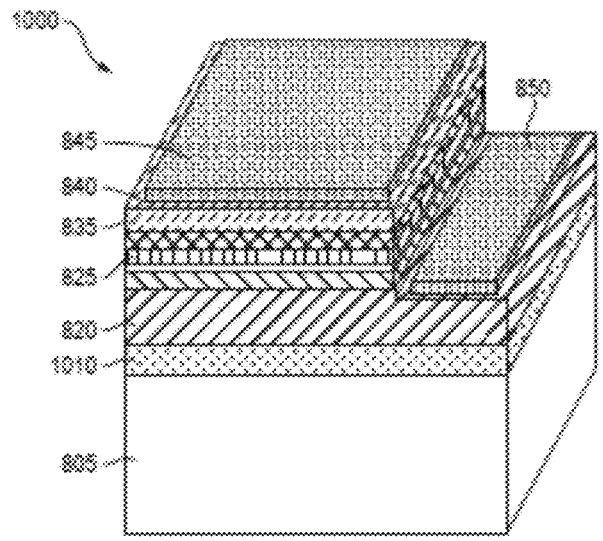
FIG. 10A is a schematic diagraph of a light-emitting device fabricated in accordance with various embodiments of the invention.
Figure 10B:
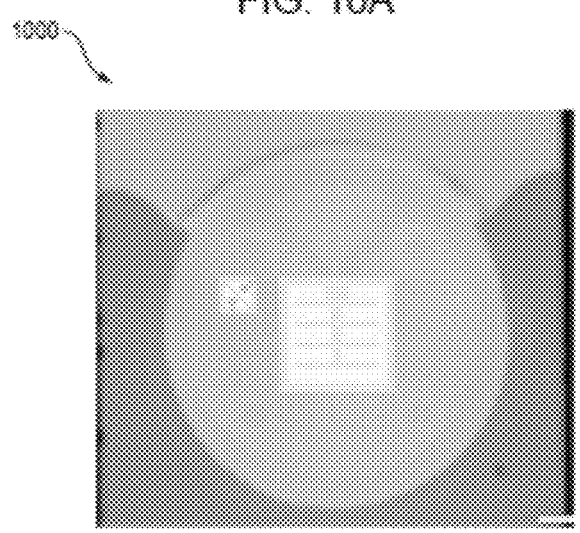
FIG. 10B is a plan view photograph of the light-emitting device of FIG. 10A during emission of light having a peak wavelength of approximately 230 nm in accordance with various embodiments of the invention.

FIG. 10A is a schematic view of a UV LED 1000 fabricated on an AlN substrate in accordance with embodiments of the present invention. As shown, the UV LED 1000 features a set of layers epitaxially grown over the W-infused single-crystal AlN substrate 805 and two top-side metal contacts 845, 850. Specifically, immediately above the substrate is a 500 nm layer 1010 of undoped (i.e., unintentionally doped) AlN, topped with a bottom contact layer 820 of n-doped (with Si at a concentration of $2\times10^{18}$ cm$^{-3}$) $Al_{0.83}Ga_{0.17}N$ that is 500 nm thick. Above the bottom contact layer 820 is a MQW layer 825 featuring five sets of a 2 nm thick $Al_{0.78}Ga_{0.22}N$ quantum well and a 6 nm thick $Al_{0.85}Ga_{0.15}N$ barrier, all of which are undoped. Above the MQW layer 825 is a 10 nm thick electron-blocking layer 830 formed of undoped $Al_{0.95}Ga_{0.05}N$. Above the electron-blocking layer 830 is an undoped graded layer 835 graded from $Al_{0.95}Ga_{0.05}N$ to GaN over a thickness of 30 nm. Finally, over the graded layer 835 is a 10 nm thick p-doped (with Mg at a concentration of $1\times10^{19}$ cm$^{-3}$) GaN cap layer 840. The p-metal layer 845 is formed over the cap layer 840, while the n-metal layer 850 is formed over the bottom contact layer 850 (revealed by etching away the overlying structure, as described above). FIG. 10B is a plan-view photograph of the UV LED 1000 of FIG. 10A when emitting light at approximately 230 nm. Devices such as that depicted in FIGS. 10A and 10B exhibited output powers between 20 μW and 500 μW at currents of 20 mA and at room temperature, continuous wave (CW) operation. Such output powers are indicative of external quantum efficiencies ranging from 0.02% to 0.5% in the wavelength range of 228 nm to 238 nm.

Figure 11A:
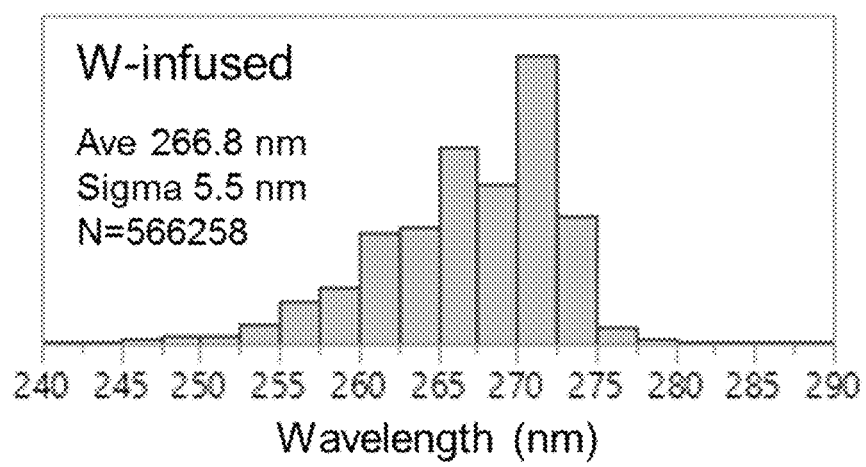
FIG. 11A is a graph of distribution of emission wavelength of UV LEDs fabricated on W-infused single-crystal AlN substrates in accordance with various embodiments of the invention.
Figure 11B:
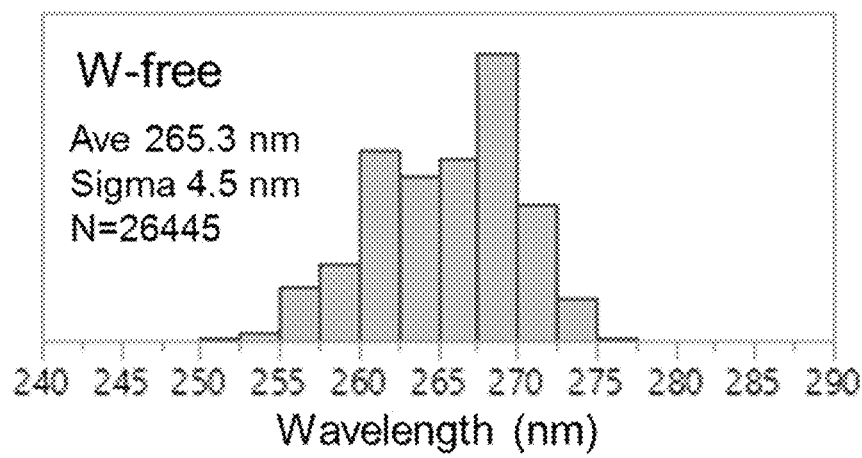
FIG. 11B is a graph of distribution of emission wavelength of UV LEDs fabricated on W-free single-crystal AlN substrates.
Figures 11C, 11D:
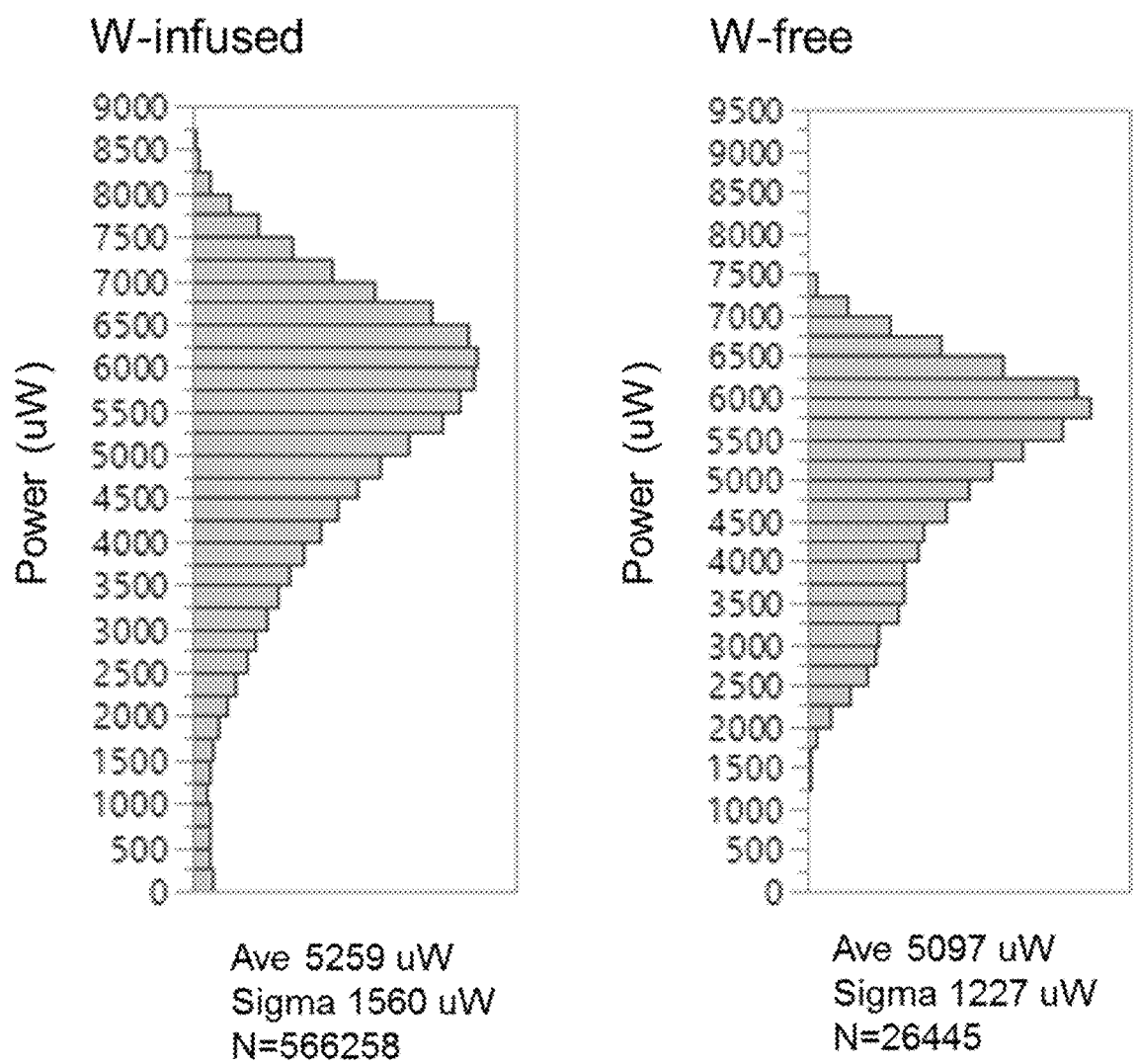
FIG. 11C is a graph of distribution of emission power of UV LEDs fabricated on W-infused single-crystal AlN substrates in accordance with various embodiments of the invention.
FIG. 11D is a graph of distribution of emission power of UV LEDs fabricated on W-free single-crystal AlN substrates.

UV LEDs similar to those depicted in FIG. 10A were fabricated on W-infused single-crystal AlN substrates fabricated in accordance with embodiments of the present invention. For comparison, identical devices were fabricated on single-crystal AlN that lacked infusion of W as detailed herein. FIGS. 11A and 11B compare the emission wavelengths of the two groups of devices. The average emission wavelengths of the devices on both types of substrates were approximately the same and about 266 nm. FIGS. 11C and 11D compare the emission powers of the two groups of devices. As shown, the average emission power of the devices fabricated on the W-infused AlN substrates was, surprisingly, more than 3% higher than that of devices fabricated on AlN substrates without the W infusion. While not wishing to be bound by theory, the present inventors postulate that the superior device results arise from factors such as impurity gettering by the W precipitates and increased photon extraction due to the presence of the W precipitates.

The growth of bulk single crystals has been described herein primarily as being implemented by what is commonly referred to as a "sublimation" or "sublimation-recondensation" technique wherein the source vapor is produced at least in part when, for production of AlN, crystalline solids of AlN or other solids or liquids containing AlN, Al or N sublime preferentially. However, the source vapor may be achieved in whole or in part by the injection of source gases or the like techniques that some would refer to as "high-temperature CVD." Also, other terms are sometimes used to describe these and techniques that are used to grow bulk single AlN crystals in accordance with embodiments of the invention. Therefore, the terms "depositing," "growing," "depositing vapor species," and like terms are used herein to generally cover those techniques by which the crystal may be grown pursuant to embodiments of this invention.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. A crystal boule comprising a single-crystalline AlN portion and a plurality of single-crystalline tungsten (W) inclusions disposed within a volume of the crystal boule, wherein a total concentration of W within the crystal boule ranges from 1 ppm to 500 ppm by weight.

2. The crystal boule of claim 1, wherein the total concentration of W within the crystal boule ranges from approximately 5 ppm to approximately 210 ppm by weight.

3. The crystal boule of claim 1, wherein the crystal boule is free of crystalline defects associated with the single-crystalline W inclusions.

4. The crystal boule of claim 1, wherein a maximum diameter of the crystal boule ranges from approximately 50 mm to approximately 150 mm.

5. The crystal boule of claim 1, wherein a minimum diameter of the crystal boule ranges from approximately 25 mm to approximately 100 mm.

6. The crystal boule of claim 1, wherein a length of the crystal boule ranges from approximately 15 mm to approximately 45 mm.

7. The crystal boule of claim 1, wherein the total concentration of W within the crystal boule ranges from approximately 20 ppm to approximately 200 ppm.

8. The crystal boule of claim 1, wherein the total concentration of W within the crystal boule ranges from approximately 200 ppm to approximately 500 ppm.

9. A crystal AlN substrate cut from the crystal boule of claim 1, the substrate having a thickness between 100 μm and 2 mm, wherein a plurality of single-crystalline and/or polycrystalline tungsten (W) inclusions is apparent on a cut face of the substrate.

10. The crystal AlN substrate of claim 9, wherein a diameter of the substrate is at least 25 mm.

11. The crystal AlN substrate of claim 9, wherein a diameter of the substrate is at least 50 mm.

12. The crystal AlN substrate of claim 9, wherein a diameter of the substrate is at most 100 mm.

13. The crystal AlN substrate of claim 9, wherein a diameter of the substrate is at most 150 mm.

14. The crystal AlN substrate of claim 9, wherein the plurality of single-crystalline and/or polycrystalline W inclusions form a pattern of striations on the cut face, the striations extending radially toward an outer edge of the substrate.

15. The crystal AlN substrate of claim 9, wherein a density of the plurality of single-crystalline and/or polycrystalline W inclusions apparent on the cut face ranges from approximately 10 to approximately $1 \times 10^5$ cm$^{-2}$.

16. The crystal AlN substrate of claim 15, wherein the density of the plurality of single-crystalline and/or polycrystalline W inclusions apparent on the cut face ranges from approximately 10 to approximately $1 \times 10^3$ cm$^{-2}$.

17. The crystal AlN substrate of claim 15, wherein the density of the plurality of single-crystalline and/or polycrystalline W inclusions apparent on the cut face ranges from approximately $1 \times 10^3$ to approximately $1 \times 10^5$ cm$^{-2}$.

18. The crystal AlN substrate of claim 9, wherein the substrate is free of crystalline defects associated with the plurality of single-crystalline and/or polycrystalline W inclusions.

19. A light-emitting device comprising the crystal AlN substrate of claim 9.

20. The light-emitting device of claim 19, wherein the light-emitting device is a light-emitting diode configured to emit ultraviolet light, or a laser configured to emit ultraviolet light.

* * * * *